United States Patent
Yang et al.

(10) Patent No.: US 9,909,814 B2
(45) Date of Patent: *Mar. 6, 2018

(54) FLEXIBLE THERMAL GROUND PLANE AND MANUFACTURING THE SAME

(71) Applicant: Kelvin Thermal Technologies, Inc., Boulder, CO (US)

(72) Inventors: Ronggui Yang, Broomfield, NY (US); Yung-Cheng Lee, Boulder, CO (US); Victor M. Bright, Boulder, CO (US); Chen Li, Columbia, SC (US); Christopher Oshman, Boulder, CO (US); Bo Shi, Nanjing (CN); Jen-Hau Cheng, Boulder, CO (US); George P. Peterson, Atlanta, GA (US)

(73) Assignee: KELVIN THERMAL TECHNOLOGIES, INC., Boulder, CO (US)

( * ) Notice: Subject to any disclaimer, the term of this patent is extended or adjusted under 35 U.S.C. 154(b) by 188 days.

This patent is subject to a terminal disclaimer.

(21) Appl. No.: 14/861,708

(22) Filed: Sep. 22, 2015

(65) Prior Publication Data

US 2016/0187070 A1    Jun. 30, 2016

Related U.S. Application Data

(63) Continuation of application No. 12/719,775, filed on Mar. 8, 2010, now Pat. No. 9,163,883, and a
(Continued)

(51) Int. Cl.
*F28D 15/04* (2006.01)
*F28D 15/02* (2006.01)
(Continued)

(52) U.S. Cl.
CPC .......... *F28D 15/0241* (2013.01); *B23P 15/26* (2013.01); *F28D 15/0233* (2013.01);
(Continued)

(58) Field of Classification Search
USPC .................................................. 165/104.26
See application file for complete search history.

(56) References Cited

U.S. PATENT DOCUMENTS

| 4,000,776 A | 1/1977 | Kroebig et al. |
| 4,279,294 A * | 7/1981 | Fitzpatrick ............... F24J 3/081 165/104.26 |

(Continued)

FOREIGN PATENT DOCUMENTS

| WO | 2008044823 A1 | 4/2008 |
| WO | WO 2008044823 A1 * | 4/2008 ........... F28D 15/046 |
| WO | 2013144444 | 10/2013 |

OTHER PUBLICATIONS

International Search Report and Written Opinion, as issued in connection with International Patent Application No. PCT/US2015/050031, dated Dec. 18, 2015, 10 pgs.
(Continued)

*Primary Examiner* — Jianying Atkisson
*Assistant Examiner* — Paul Schwarzenberg

(57) ABSTRACT

Methods, apparatuses, and systems are disclosed for flexible thermal ground planes. A flexible thermal ground plane may include a support member. The flexible thermal ground plane may include an evaporator region or multiple evaporator regions configured to couple with the support member. The flexible thermal ground plane may include a condenser region or multiple condenser regions configured to couple with the support member. The evaporator and condenser region may include a microwicking structure. The evaporator and condenser region may include a nanowicking structure coupled with the micro-wicking structure, where the
(Continued)

nanowicking structure includes nanorods. The evaporator and condenser region may include a nanomesh coupled with the nanorods and/or the microwicking structure. Some embodiments may include a micromesh coupled with the nanorods and/or the microwicking structure.

27 Claims, 41 Drawing Sheets

Related U.S. Application Data continuation of application No. 14/681,624, filed on Apr. 8, 2015, which is a continuation of application No. 12/719,775, filed on Mar. 8, 2010, now Pat. No. 9,163,883.

(60) Provisional application No. 61/158,086, filed on Mar. 6, 2009.

(51) Int. Cl.
  *H01L 23/367*   (2006.01)
  *H01L 23/427*   (2006.01)
  *B23P 15/26*    (2006.01)
  *H01L 23/473*   (2006.01)

(52) U.S. Cl.
  CPC ......... *F28D 15/04* (2013.01); *F28D 15/046* (2013.01); *H01L 23/3677* (2013.01); *H01L 23/427* (2013.01); *H01L 23/473* (2013.01); *B23P 2700/09* (2013.01); *H01L 2924/0002* (2013.01); *Y10T 29/49353* (2015.01)

(56) References Cited

U.S. PATENT DOCUMENTS

| | | | |
|---|---|---|---|
| 4,854,379 A | | 8/1989 | Shaubach et al. |
| 5,000,256 A | * | 3/1991 | Tousignant ......... H01L 23/3737 165/104.19 |
| 5,343,940 A | * | 9/1994 | Jean ................... F28D 15/0241 165/104.33 |
| 5,560,423 A | * | 10/1996 | Larson ................ F28D 15/0241 165/104.26 |
| 6,446,706 B1 | * | 9/2002 | Rosenfeld ........... F28D 15/0241 165/104.26 |
| 6,533,029 B1 | | 3/2003 | Phillips |
| 6,994,151 B2 | | 2/2006 | Zhou et al. |
| 7,069,978 B2 | | 7/2006 | Rosenfeld et al. |
| 7,278,469 B2 | * | 10/2007 | Sasaki ................. F28D 15/0241 165/104.26 |
| 8,579,018 B1 | | 11/2013 | Roper et al. |
| 8,807,203 B2 | | 8/2014 | MacDonald et al. |
| 9,136,883 B1 | | 10/2015 | Yang et al. |
| 2003/0042009 A1 | | 3/2003 | Phillips |
| 2003/0102118 A1 | | 6/2003 | Sagal et al. |
| 2005/0059238 A1 | | 3/2005 | Chen et al. |
| 2005/0280128 A1 | | 12/2005 | Mok et al. |
| 2006/0090882 A1 | | 5/2006 | Sauciuc |
| 2006/0098411 A1 | | 5/2006 | Lee |
| 2006/0124280 A1 | | 6/2006 | Lee et al. |
| 2006/0131002 A1 | | 6/2006 | Mochizuki et al. |
| 2006/0196640 A1 | | 9/2006 | Siu |
| 2006/0213648 A1 | | 9/2006 | Chen et al. |
| 2006/0283574 A1 | | 12/2006 | Huang |
| 2006/0283576 A1 | | 12/2006 | Lai et al. |
| 2007/0035927 A1 | | 2/2007 | Erturk et al. |
| 2007/0056714 A1 | | 3/2007 | Wong |
| 2007/0068657 A1 | | 3/2007 | Yamamoto et al. |
| 2007/0089864 A1 | | 4/2007 | Chang et al. |
| 2007/0107875 A1 | | 5/2007 | Lee et al. |
| 2007/0158050 A1 | * | 7/2007 | Norley .................... H01L 24/29 165/80.4 |
| 2008/0067502 A1 | * | 3/2008 | Chakrapani ........... H01L 21/563 257/40 |
| 2008/0128898 A1 | | 6/2008 | Henderson et al. |
| 2008/0210407 A1 | | 9/2008 | Kim et al. |
| 2008/0272482 A1 | | 11/2008 | Jensen et al. |
| 2009/0236080 A1 | | 9/2009 | Lin et al. |
| 2009/0294104 A1 | | 12/2009 | Lin et al. |
| 2010/0084113 A1 | | 4/2010 | Lee |
| 2010/0139767 A1 | | 6/2010 | Hsieh et al. |
| 2010/0200199 A1 | | 8/2010 | Habib et al. |
| 2010/0300656 A1 | | 12/2010 | Lu |
| 2011/0017431 A1 | | 1/2011 | Yang et al. |
| 2011/0205708 A1 | | 8/2011 | Andry et al. |
| 2012/0061127 A1 | | 3/2012 | Fields et al. |
| 2013/0199770 A1 | | 8/2013 | Cherian |
| 2013/0269913 A1 | | 10/2013 | Ueda et al. |
| 2013/0327504 A1 | | 12/2013 | Bozorgi et al. |
| 2015/0226493 A1 | | 8/2015 | Yang et al. |

OTHER PUBLICATIONS

International Search Report and Written Opinion, as issued in connection with International Patent Application No. PCT/US2015/050771, dated Dec. 18, 2015, 8 pgs.
U.S. Office Action in U.S. Appl. No. 12/719,775, dated Nov. 9, 2012, 15 pgs.
U.S. Office Action in U.S. Appl. No. 12/719,775, dated May 9, 2013, 15 pgs.
U.S. Office Action in U.S. Appl. No. 12/719,775, dated Oct. 2, 2013, 15 pgs.
U.S. Office Action in U.S. Appl. No. 12/719,775, dated Mar. 26, 2014, 23 pgs.
U.S. Office Action in U.S. Appl. No. 12/719,775, dated Feb. 6, 2015, 24 pgs.
U.S. Notice of Allowance in U.S. Appl. No. 12/719,775, dated Aug. 4, 2015, 8 pgs.
U.S. Office Action in U.S. Appl. No. 14/681,624, dated Oct. 23, 2015, 11 pgs.
International Search Report and Written Opinion dated Jul. 15, 2016 in related PCT Application No. PCT/US2015/57885 (11 pages).
U.S. Office Action in U.S. Appl. No. 14/681,624, dated May 5, 2016, 10 pgs.
U.S. Notice of Allowance in U.S. Appl. No. 14/681,624, dated Nov. 17, 2016, 7 pgs.
U.S. Office Action in U.S. Appl. No. 14/925,787, dated Aug. 9, 2017, 15 pgs.

* cited by examiner

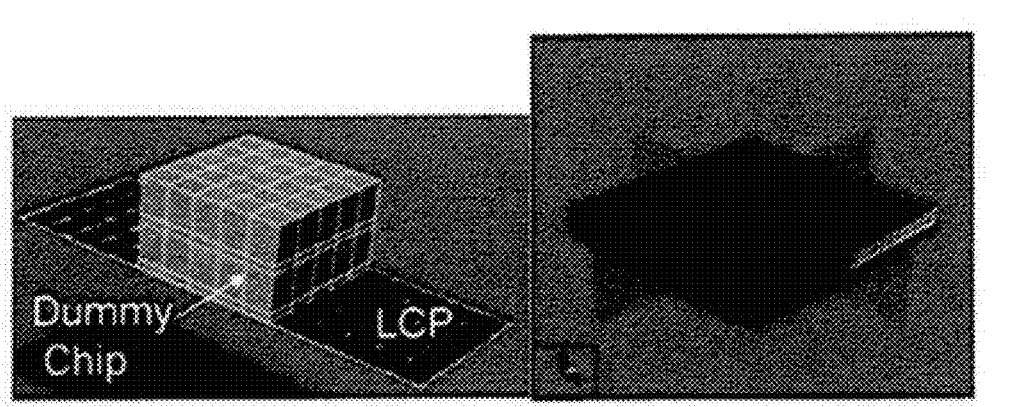
FIG. 17-a                FIG. 17-b
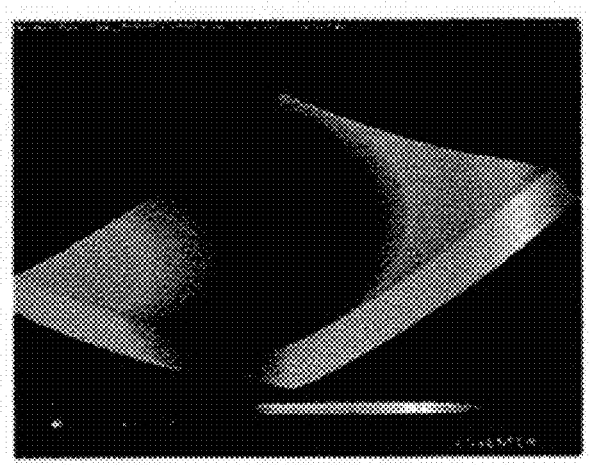
FIG. 17-c

FLEXIBLE THERMAL GROUND PLANE AND MANUFACTURING THE SAME

CROSS-REFERENCE TO RELATED APPLICATIONS

This application is a continuation of U.S. patent application Ser. No. 12/719,775, filed on Mar. 8, 2010, and entitled "Flexible Thermal Ground Plane and Manufacturing the Same," which claims priority benefit of U.S. provisional patent application Ser. No. 61/158,086, filed on Mar. 6, 2009, and entitled "Flexible Thermal Ground Plane and Manufacturing the Same and Means to Fabricate a Flexible Thermal Ground Plane," the entire disclosure of which is herein incorporated by reference for all purposes.

This application is also a continuation of U.S. patent application Ser. No. 14/681,624, filed on Mar. 8, 2015, and entitled "Flexible Thermal Ground Plane and Manufacturing the Same," which is a continuation of U.S. patent application Ser. No. 12/719,775, filed on Mar. 8, 2010, and entitled "Flexible Thermal Ground Plane and Manufacturing the Same," which claims priority benefit of U.S. provisional patent application Ser. No. 61/158,086, filed on Mar. 6, 2009, and entitled "Flexible Thermal Ground Plane and Manufacturing the Same and Means to Fabricate a Flexible Thermal Ground Plane," the entire disclosure of which is herein incorporated by reference for all purposes.

GOVERNMENT SUPPORT CLAUSE

This invention was made with government support under Grant No. N66001-08-C-2006 awarded by DOD/DARPA and Grant No. HR0011-06-1-0048 awarded by the DOD/DARPA. The government has certain rights in the invention.

BACKGROUND

This application relates generally to thermal ground planes. More specifically, this application relates to methods, apparatuses, and systems for flexible thermal ground planes.

The complexity and size of integrated circuits may been limited by the heat generated. Heat pipes have been used to transfer heat efficiently from one location to another. They have also been used to cool integrated circuits. The existing heat pipes for these purposes may consist of a rigid structure composed of copper, silicon, etc. Some modern electrical devices and systems demand a flexible circuit board along with a high capacity for heat dissipation.

There is thus a need for methods, systems, and devices that may also be flexible while transferring heat efficiently from one location to another or spread high flux heat from a small area to low heat flux over a larger area.

SUMMARY

Embodiments of the invention include a method for Certain embodiments thus provide methods, systems, and devices that may include a flexible thermal ground plane. Embodiments of flexible thermal ground planes may provide extremely high thermal performance with high evaporation/condensation heat transfer and effective liquid supply. Flexible configurations may be enabled by using polymer casing laminated and covered by moisture barrier coatings, enabled by atomic layer deposition, chemical vapor deposition, physical vapor deposition, or thin metal laminate, merely by way of example. Embodiments of flexible thermal ground planes may also involve low cost construction resulting from large size manufacturing, e.g. 3 ft wide and 1000 ft long, merely by way of example. For example, flexible thermal ground plane construction may take advantage of flexible circuit board manufacturing technology. Large size flexible thermal ground planes may thus be constructed for some embodiments, e.g. 20 cm by 40 cm by 1 mm, merely by way of example.

Methods, apparatuses, and systems are disclosed for flexible thermal ground planes. A flexible thermal ground plane may include a support member. The flexible thermal ground plane may include an evaporator region configured to couple with the support member. The evaporator region may include a micro-wicking structure. The evaporator region may include a nanowicking structure coupled with the micro-wicking structure, where the nanowicking structure includes nanorods. The evaporator region may include a micro-mesh or nano-mesh coupled with the micro-wicking or nanowicking structure.

Some embodiments may include a flexible thermal ground plane. The flexible thermal ground plane may include a flexible support member. The flexible support member may be configured to enclose a working fluid. One or more evaporators regions may couple with the flexible support member. One or more condenser regions may couple with the flexible support. The flexible thermal ground plane may include a working fluid that is enclosed by the flexible support member.

In some embodiments of the flexible thermal ground plane, the support member may include a polymer layer. The polymer layer may include a liquid crystal polymer. In some embodiments of the flexible thermal ground plane, the support member may include a thin metal layer. In some embodiments, flexible thermal ground plane may include a moisture barrier layer coupled with the polymer layer. The moisture barrier layer may include an atomic layer deposition coating, a chemical vapor deposition coating, a physical vapor deposition coating or thin metal laminate coating.

In some embodiments, the evaporator and/or the condenser region may include a microwicking structure. In some embodiments, the evaporator and/or condenser region may include a nanowicking structure. In some embodiments, the evaporator and the condenser region may include a hybrid micro/nano wicking structure. The nanowicking structure may include nanorods.

In some embodiments, the flexible thermal ground plane may include a mesh layer coupled with the evaporator region and/or the condenser region. In some embodiments of the flexible thermal ground plane, a mesh layer may be included and the mesh layer separates a vapor chamber from a liquid channel. In some embodiments, the mesh layer may include a nanomesh layer.

Some embodiments may include a thermal ground plane system. The thermal ground plane system may include a support member. The thermal ground plane system may include an evaporator region configured to couple with the support member. The evaporator region may include a first wicking structure. The thermal ground plane system may include a condenser region configured to couple with the support member. The condenser region may include a second wicking structure.

In some embodiments, the thermal ground plane system may also include a mesh structure coupled with the first wicking structure and the second wicking structure.

In some embodiments of a thermal ground plane system, at least one of the first wicking structure or the second wicking structures includes a microwicking structure. In some embodiments of a thermal ground plane system, at least one of the first wicking structure or the second wicking structures includes a nanowicking structure. In some embodiments, the thermal ground plane system may include a third wicking structure, where the third structure couples with the first wicking structure and the mesh structure. The third wicking structure may include a microwicking structure or a nanowicking structure. The third wicking structure may include nanorods and/or a nanomesh. In some embodiments, the thermal ground plane system may include a moisture barrier coating coupled with the support member. In some embodiments, the support member may include a flexible polymer member.

In some embodiments, the thermal ground plane system may include high thermal conductivity thermal vias coupled with the support member. In some embodiments, the thermal ground plane system may include a high thermal conductivity member coupled with the support member, wherein at least one of the first wicking structure or second wicking structure is made on the high thermal conductivity member.

Some embodiments may include method of fabricating a thermal ground plane. The method may include providing a support member. The method may include coupling a plurality of microwicking structures with a surface of the support member.

In some embodiments, the method of fabricating a thermal ground plane may include a support member that includes a flexible member. The flexible member may include a polymer layer. The polymer layer may include a liquid crystal polymer. The flexible member may be a thin metal layer in some embodiments.

In some embodiments, the method of fabricating a thermal ground plane may include coupling a mesh structure to the plurality of microwicking structures. In some embodiments, the method of fabricating a thermal ground plane may include coupling a nanowicking structure between the microwicking structure and the mesh structure. In some embodiments, the method of fabricating a thermal ground plane may include coupling a mesh structure with the plurality of nanowicking structures. In some embodiments, the method of fabricating a thermal ground plane may further include coupling a microwicking structure between at least one of the microwicking structures and the mesh structure.

In some embodiments, the method of fabricating a thermal ground plane may further include coupling a plurality of nanowicking structures with the surface of the support member. In some embodiments, the method of fabricating a thermal ground plane may include coupling a second microwicking structure with at least one of the plurality of microwicking structures. In some embodiments, the method of fabricating a thermal ground plane may include coupling a nanowicking structure with at least one of the plurality of microwicking structures.

In some embodiments, the method of fabricating a thermal ground plane may include applying a coating to the mesh structure, where the coating creates at least one hydrophobic region or one hydrophilic region. In some embodiments, the method of fabricating a thermal ground plane may include applying a coating to the mesh structure, wherein the coating creates corrosion protection for the thermal ground plane. In some embodiments, the method of fabricating a thermal ground plane may include creating a moisture barrier coupled with the support member. Creating a moisture barrier may include forming a moisture barrier coating using at least one of atomic layer deposition, chemical vapor deposition, physical vapor deposition, or thin metal lamination.

BRIEF DESCRIPTION OF THE FIGURES

The present invention is described in conjunction with the appended figures:

FIGS. 17A, 17B, and 17C show micro/nano-scaled evaporator structures, in accordance with various embodiments.

Figure 1:
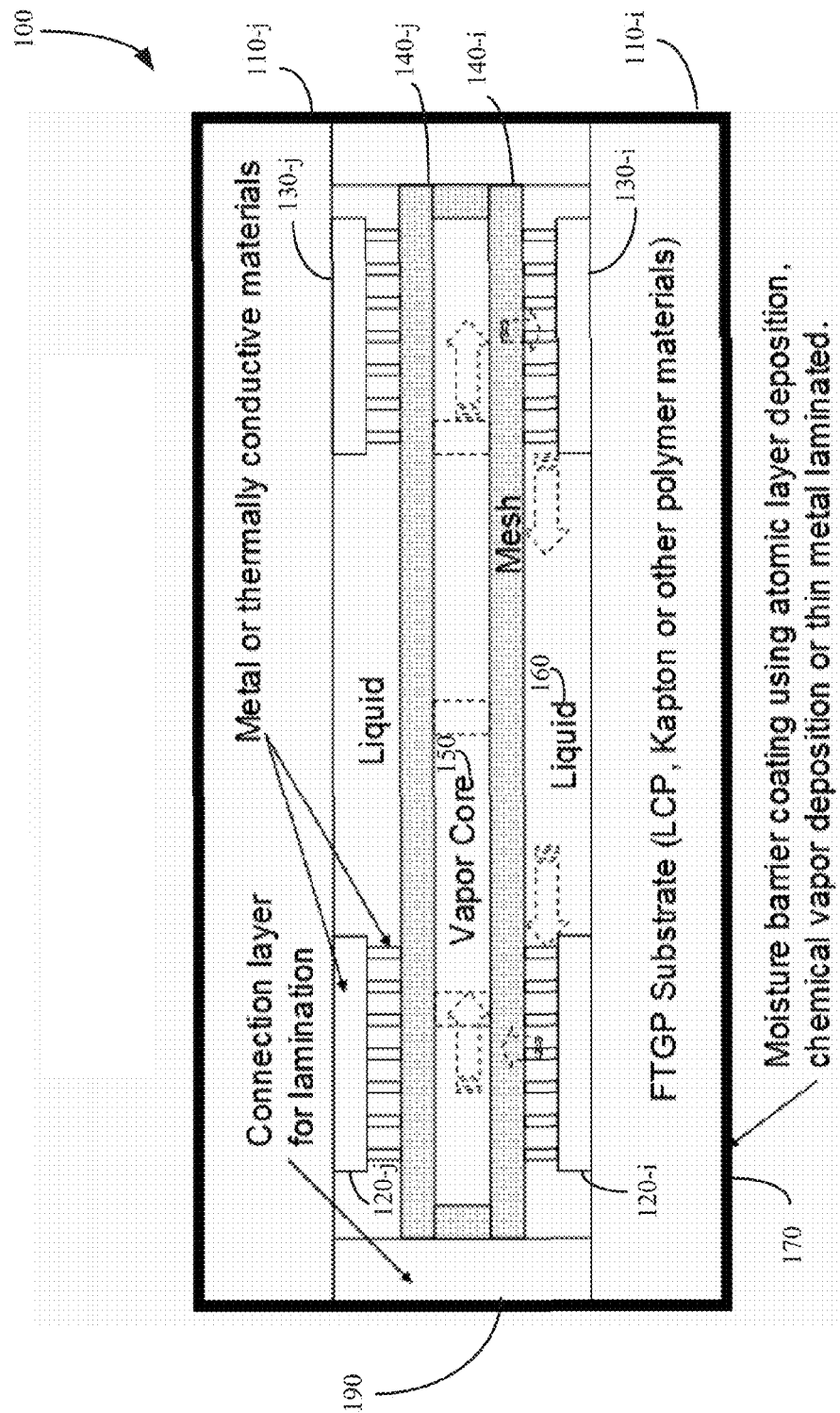
FIG. 1 provides a diagram of a thermal ground plane, in accordance with various embodiments.

In the appended figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION

The ensuing description provides exemplary embodiments only, and is not intended to limit the scope, applicability or configuration of the disclosure. Rather, the ensuing description of the exemplary embodiments will provide those skilled in the art with an enabling description for implementing one or more exemplary embodiments. It being understood that various changes may be made in the function and arrangement of elements without departing from the spirit and scope of the invention as set forth in the appended claims.

Specific details are given in the following description to provide a thorough understanding of the embodiments. However, it will be understood by one of ordinary skill in the art that the embodiments may be practiced without these specific details. For example, circuits, systems, networks, processes, and other elements in the invention may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process may be terminated when its operations are completed, but could have additional steps not discussed or included in a figure. Furthermore, not all operations in any particularly described process may occur in all embodiments. A process may correspond to a method, a function, a procedure, a subroutine, a subprogram, etc. When a process corresponds to a function, its termination corresponds to a return of the function to the calling function or the main function.

Certain embodiments thus provide methods, systems, and devices that may include a flexible thermal ground plane. Embodiments of flexible thermal ground planes may provide extremely high thermal performance with high evaporation/condensation heat transfer and effective liquid supply. Flexible configurations may be enabled by using polymer casing laminated and covered by moisture barrier coatings, enabled by atomic layer deposition, chemical vapor deposition, physical vapor deposition, or thin metal laminate, merely by way of example. Embodiments of flexible thermal ground planes may also involve low cost construction resulting from large size manufacturing, e.g. 3 ft wide and 1000 ft long, merely by way of example. For example, flexible thermal ground plane construction may take advantage of flexible circuit board manufacturing technology. Large size flexible thermal ground planes may thus be constructed for some embodiments, e.g. 20 cm by 40 cm by 1 mm, merely by way of example.

Methods, apparatuses, and systems are disclosed for flexible thermal ground planes. A flexible thermal ground plane may include a support member. The flexible thermal ground plane may include an evaporator region configured to couple with the support member. The evaporator region may include a micro-wicking structure. The evaporator region may include a nanowicking structure coupled with the micro-wicking structure, where the nanowicking structure includes nanorods. The evaporator region may include a micro-mesh or nanomesh coupled with the micro-wicking or nanowicking structure.

Some embodiments may include a flexible thermal ground plane. The flexible thermal ground plane may include a flexible support member. The flexible support member may be configured to enclose a working fluid. One or more evaporators regions may couple with the flexible support member. One or more condenser regions may couple with the flexible support. The flexible thermal ground plane may include a working fluid that is enclosed by the flexible support member.

In some embodiments of the flexible thermal ground plane, the support member may include a polymer layer. The polymer layer may include a liquid crystal polymer. In some embodiments of the flexible thermal ground plane, the support member may include a thin metal layer. In some embodiments, flexible thermal ground plane may include a moisture barrier layer coupled with the polymer layer. The moisture barrier layer may include an atomic layer deposition coating, a chemical vapor deposition coating, a physical vapor deposition coating or thin metal laminate coating.

In some embodiments, the evaporator and/or the condenser region may include a microwicking structure. In some embodiments, the evaporator and/or condenser region may include a nanowicking structure. In some embodiments, the evaporator and the condenser region may include a hybrid micro/nano wicking structure. The nanowicking structure may include nanorods.

In some embodiments, the flexible thermal ground plane may include a mesh layer coupled with the evaporator region and/or the condenser region. In some embodiments of the flexible thermal ground plane, a mesh layer may be included and the mesh layer separates a vapor chamber from a liquid channel. In some embodiments, the mesh layer may include a nanomesh layer.

Some embodiments may include a thermal ground plane system. The thermal ground plane system may include a support member. The thermal ground plane system may include an evaporator region configured to couple with the support member. The evaporator region may include a first wicking structure. The thermal ground plane system may include a condenser region configured to couple with the support member. The condenser region may include a second wicking structure.

In some embodiments, the thermal ground plane system may also include a mesh structure coupled with the first wicking structure and the second wicking structure.

In some embodiments of a thermal ground plane system, at least one of the first wicking structure or the second wicking structures includes a microwicking structure. In some embodiments of a thermal ground plane system, at least one of the first wicking structure or the second wicking structures includes a nanowicking structure. In some embodiments, the thermal ground plane system may include a third wicking structure, where the third structure couples with the first wicking structure and the mesh structure. The third wicking structure may include a microwicking structure or a nanowicking structure. The third wicking structure may include nanorods and/or a nanomesh. In some embodiments, the thermal ground plane system may include a moisture barrier coating coupled with the support member. In some embodiments, the support member may include a flexible polymer member.

In some embodiments, the thermal ground plane system may include high thermal conductivity thermal vias coupled with the support member. In some embodiments, the thermal ground plane system may include a high thermal conductivity member coupled with the support member, wherein at least one of the first wicking structure or second wicking structure is made on the high thermal conductivity member.

Some embodiments may include method of fabricating a thermal ground plane. The method may include providing a support member. The method may include coupling a plurality of microwicking structures with a surface of the support member.

In some embodiments, the method of fabricating a thermal ground plane may include a support member that includes a flexible member. The flexible member may include a polymer layer. The polymer layer may include a liquid crystal polymer. The flexible member may be a thin metal layer in some embodiments.

In some embodiments, the method of fabricating a thermal ground plane may include coupling a mesh structure to the plurality of microwicking structures. In some embodiments, the method of fabricating a thermal ground plane may include coupling a nanowicking structure between the microwicking structure and the mesh structure. In some embodiments, the method of fabricating a thermal ground plane may include coupling a mesh structure with the plurality of nanowicking structures. In some embodiments, the method of fabricating a thermal ground plane may further include coupling a microwicking structure between at least one of the microwicking structures and the mesh structure.

In some embodiments, the method of fabricating a thermal ground plane may further include coupling a plurality of nanowicking structures with the surface of the support member. In some embodiments, the method of fabricating a thermal ground plane may include coupling a second microwicking structure with at least one of the plurality of microwicking structures. In some embodiments, the method of fabricating a thermal ground plane may include coupling a nanowicking structure with at least one of the plurality of microwicking structures.

In some embodiments, the method of fabricating a thermal ground plane may include applying a coating to the mesh structure, where the coating creates at least one hydrophobic region or one hydrophilic region. In some embodiments, the method of fabricating a thermal ground plane may include applying a coating to the mesh structure, wherein the coating creates corrosion protection for the thermal ground plane. In some embodiments, the method of fabricating a thermal ground plane may include creating a moisture barrier coupled with the support member. Creating a moisture barrier may include forming a moisture barrier coating using at least one of atomic layer deposition, chemical vapor deposition, physical vapor deposition, or thin metal lamination.

FIG. 1 provides an example of a system or device 100 involving a flexible thermal ground plane configuration in accordance with various embodiments. System 100 includes one or more substrate or support members 110-$i$, 100-$j$. In some embodiments, substrate member may be flexible. A flexible substrate may be made out of numerous different materials including, but not limited to thin metal layer, liquid crystal polymers, Kapton, or other polymers materials.

System 100 also shows one or more evaporator regions 120-$i$, 120-$j$ and/or one or more condenser regions 130-$i$, 130-$j$ coupled with the support member. Evaporator regions 120 and condenser regions 130 may be also be referred to as evaporator components or condenser components respectively. Evaporator and condenser components 120, 130 respectively may include metal or thermally conductive materials. They may comprise micro-structures and/or nano-structures. Merely by way of example, evaporator region shows a micro structure coupled with a nanostructure. The nanostructure may include nanorods or nanomeshes. Coupled with the evaporator components and/or condenser components may also be mesh structure 140-$i$, 140-$j$. Mesh structure 140 may be a micro-mesh structure in some embodiments. Mesh structure 140 may be a nanomesh structure in some embodiments.

System 100 shows that mesh structure 140 may separate a vapor core 150 from a liquid channel 160. Mesh structure 140 may be a micro-mesh structure in some embodiments. Mesh structure 140 may be a nanomesh structure in some embodiments. A liquid, such as distilled water merely by way of example, may flow through the liquid channel 160, which may be part of a micro-structure layer of the system for some embodiments. At evaporator region 120, the liquid may be heated up as it pass through or around micro and/or nanostructures of evaporator region 120. The liquid may then pass through mesh structure 140 and become a vapor.

Within the vapor core 150, the vapor may then condense back to a liquid at condenser region 130, passing back through mesh structure 140 and through and/or around micro and/or nanostructures of the condenser region 130.

System 100 also shows moisture barrier 170 coupled with substrate member 110. Moisture barrier 170 may be a moisture barrier coating that may be formed in a variety of different ways including, but not limited to, atomic layer deposition, chemical vapor deposition, physical vapor deposition, or thin metal lamination. Moisture barrier 170 may be used in some embodiments to retain liquid and/or vapor within system 100. For example, substrate member 110 may be porous enough to allow for liquid to pass through it. With moisture barrier 170, liquid can be kept within the system. In some embodiments, thermal vias (not shown) made of materials with a thermal conductivity much higher than that of the substrate material may be included in substrate member 110. Thermal vias may aid in transferring heat from a source (not shown) to a flexible thermal ground plane system or device such as system 100. Some embodiments may include one or more connection layers 190.

Figure 2:
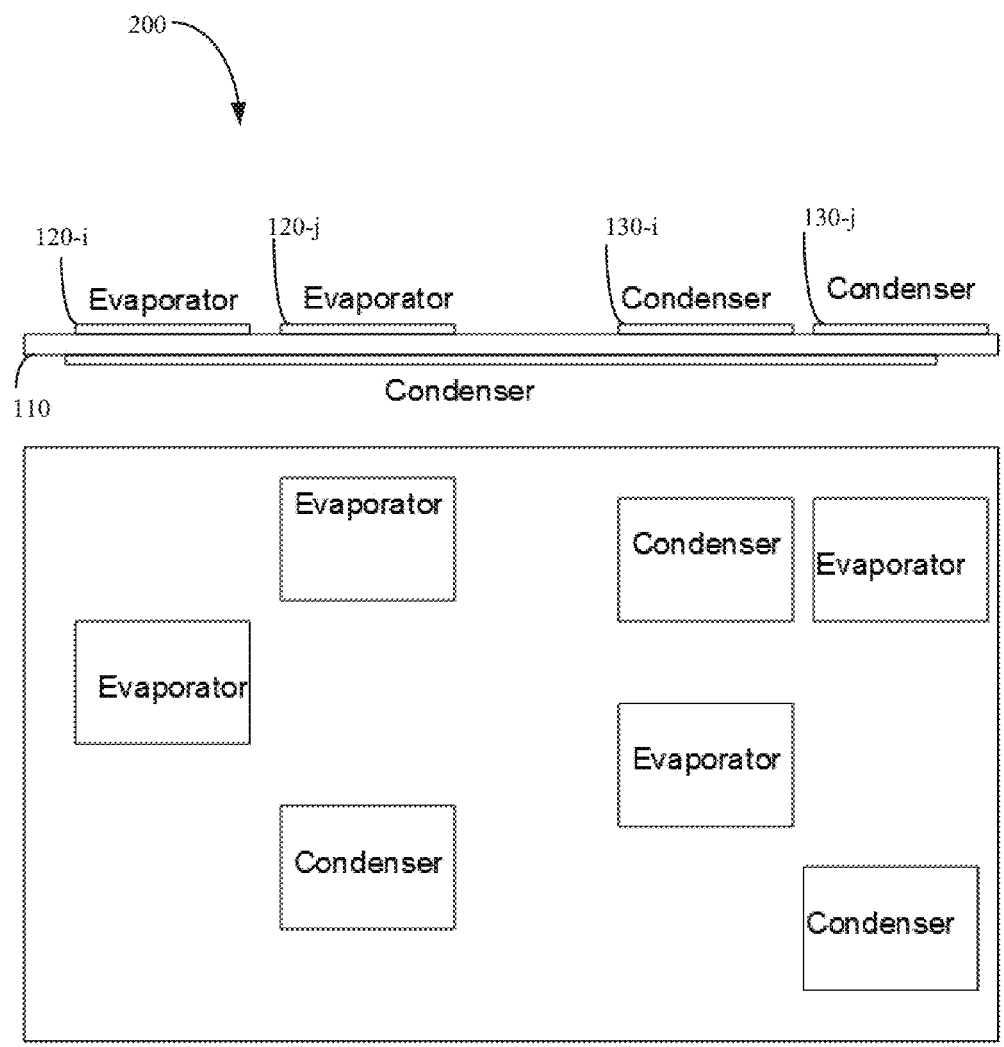
FIG. 2 provides a diagram of a thermal ground plane, in accordance with various embodiments.

FIG. 2 provides a system 200 involving a flexible thermal ground plane, which may include a flexible thermal ground plane system such as system 100. System 200 shows numerous evaporator 120 and condenser regions 130 coupled with substrate 110. Evaporator regions and condenser regions may be placed in numerous different locations on a support member. The placement of the evaporator and/or condenser regions may depend on the specific needs and/or configurations of other components that system 200 may couple with, for example.

Figure 3:
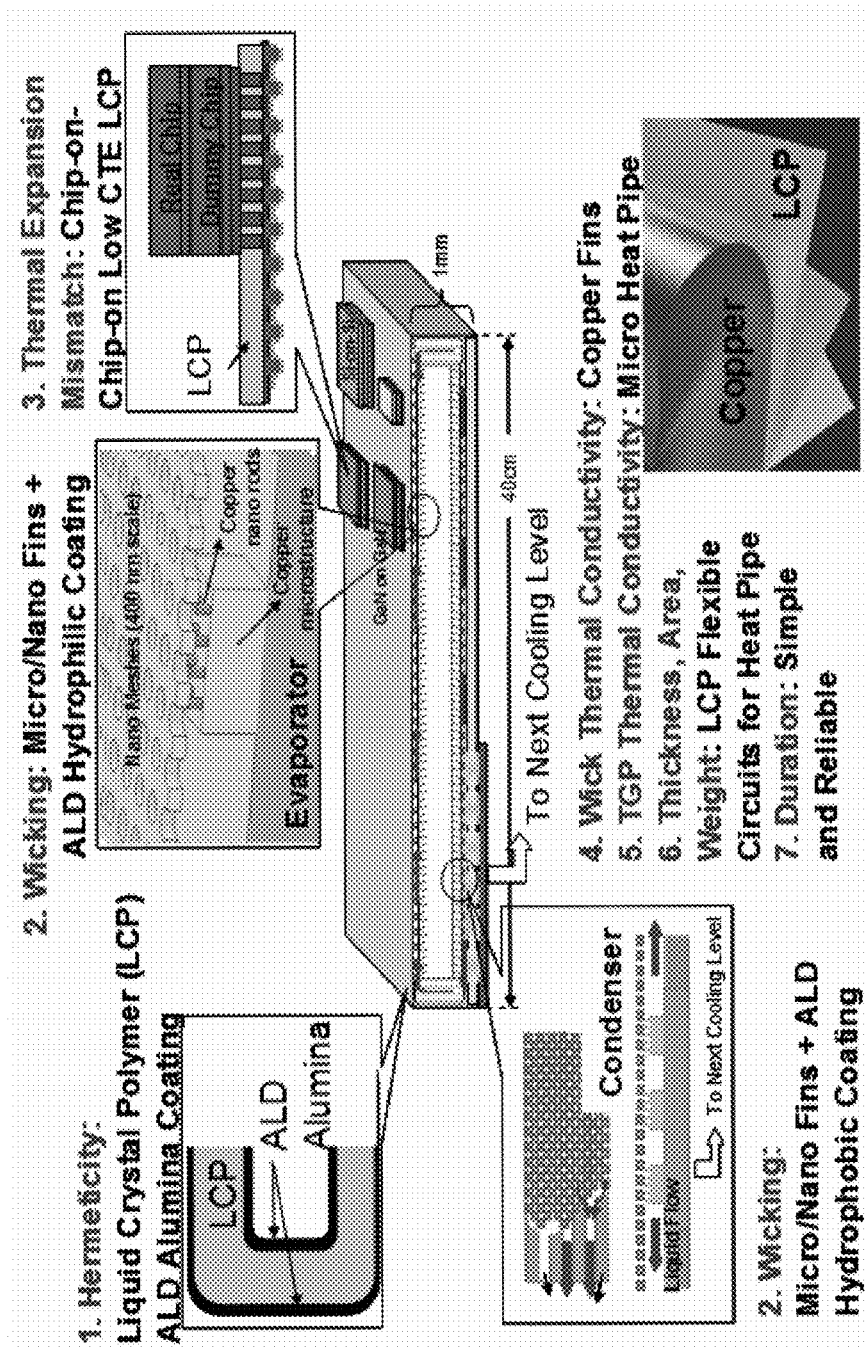
FIG. 3 provides a diagram showing various aspects of a thermal ground plane, in accordance with various embodiments.

Embodiments shown in FIG. 3 include methods for micro/nanofabrication to develop a flexible thermal ground plane (FTGP), which may serve as a stand-alone component or may be embedded in a flexible or rigid substrate for effective thermal management for some embodiments. FIG. 3 shows FTGP with micro/nano-scaled wicking structure made of copper or other solid materials for distilled water or other liquid. The flexible thermal ground plane may made hermetic through the use of liquid crystal polymer (LCP) with low moisture permeability, encapsulated by a nano-scaled alumina coating through atomic layer deposition (ALD). Some embodiments may thus include a flexible substrate or support member. The flexible substrate or support member may include a polymer material such as LCP or polyimide, merely by way of example. Embodiments may also include a moisture barrier, which may be a coating. Moisture barriers may include, but are not limited to ALD, chemical vapor deposition, physical vapor deposition, or thin metal laminate. The micro/nano wick structures may incorporate an ALD hydrophilic coating for the evaporator and an ALD hydrophobic coating for the condenser to assure effective operation under high heat flux conditions. The micro/nano wick structures may incorporate an ALD coating for liquid-corrosion protection on evaporator or condenser.

In some embodiments, micro/nano wicks may be realized as copper nanorods and nanomeshes electroplated or etched on the LCP's copper microcubes and channels through the use of nanofabrication templates, such as block copolymer templates, porous anodized alumina templates or colloidal particle polymer template, merely by way of example. The copper-based wicks may have very high thermal conductivity. With extremely efficient evaporators and condensers for water, the FTGP's thermal conductivity may be at least 100× higher than that of current common copper-alloy substrates In some embodiments, an FTGP may be fabricated using LCP flexible circuit technologies; it may be extremely thin (<1 mm) and low weight, while covering a large area. The operation of the FTGP may be simple and robust with a long lifetime.

FTGPs may be fabricated using LCP+ALD hermetic sealing, copper micro/nano wick structures with nanomesh and nanorods fabricated on microcubes on LCP or polyimide flexible circuits. Merely by way of example, an integrated 3 cm×3 cm×3 mm FTGP sample may be constructed and may demonstrate >500 W/mK performance. Refinements to the design and fabrication of FTGP's components may be carried out to improve performance (>30,000 W/mK) and reliability. Merely by way of example, 20 cm×40 cm×0.9 mm FTGP samples may be produced. Other dimensioned FTGPs may also be produced to fit the requirements of different applications Merely by way of example, the following Table 1 provides some of the innovations that may be seen with different embodiments of FTGP:

In some embodiments, FTGPs may be enabled by the following technologies, though other methods, techniques, and technologies may also be used within the spirit of the invention: maskless fabrication of the micro/nano wicking structure, atomic layer deposition ("ALD") for hydrophilic, hydrophobic, hermetic and corrosion-protective coatings. These technologies may be described as follows.

Figure 4:
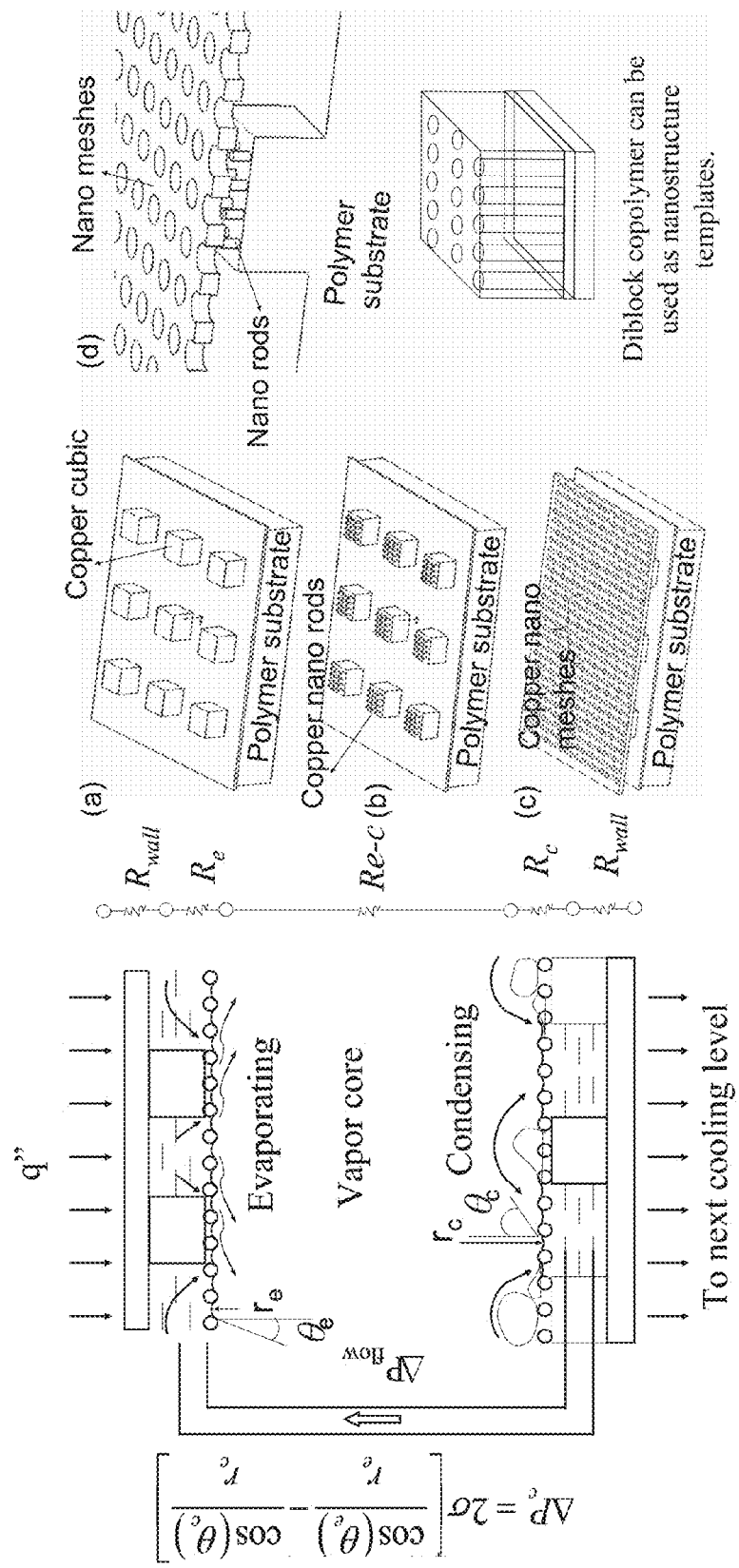
FIG. 4 shows diagrams for operating a thermal ground plane and a method of fabrication, in accordance with various embodiments.

In some embodiments, maskless fabrication of the hybrid micro/nano-scaled wicking structure for distilled water or other liquid, merely by way of example, may enable the FTGP to reach: a) ultrahigh heat transfer coefficients in both evaporation and condensation, b) low flow resistance, and/or c) high capillary pressure to sustain operation in a high-g acceleration environment. FIG. 4, for example, shows embodiments of an FTGP operation principle and a fabrication concept of the nanorods/nanomeshes. Maskless, low-cost and scaleable nano-fabrication using block copolymer as plating/etching templates may be compatible with current flexible circuit manufacturing, the resolution of which is typically limited to 25 µm lines/spacings.

FIG. 4 shows embodiments of a FTGP, where on the left, the liquid may be supplied by the capillary force difference between the evaporator and the condenser in some embodiments. Distilled water or other liquid may flow through the micro-scaled features to the nano-scaled surface for effective evaporation. The vapor may condense on the hydrophobic surfaces and the droplets may be absorbed by the hydrophilic wick. Condensate may be pumped back to the evaporator by the capillary pressure, completing the liquid-vapor-liquid cycle and starting the next one.

Referring again to FIG. 4, embodiments of a micro/nano wicking structure may be shown on the right. Nanomeshes may form a membrane that separates the vapor core from the liquid. Nanomeshes and nanorods may be etched or plated using nanofabrication templates, such as block copolymer templates, porous alumina templates or colloidal particle templates, for maskless nano-fabrication.

Figure 5:
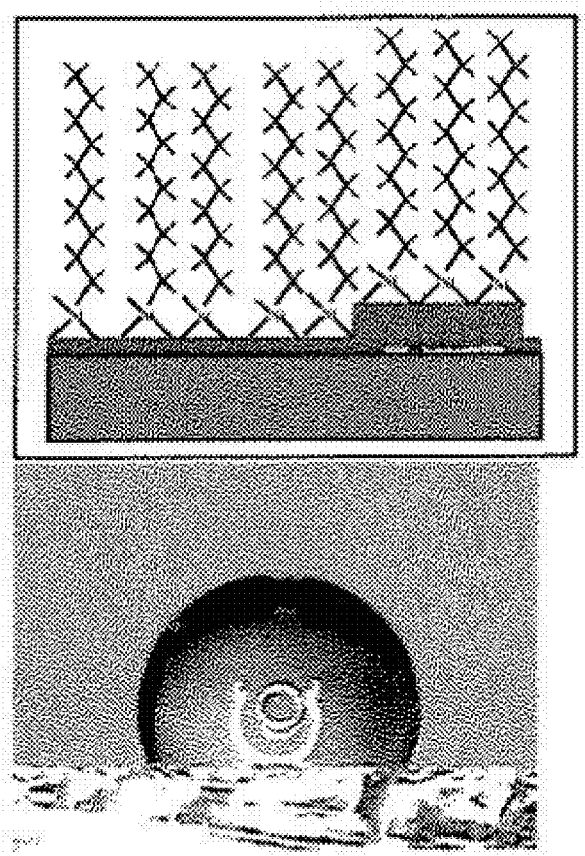
FIG. 5 shows aspects of a thermal ground plane involving an atomic layer deposition, in accordance with various embodiments.
Figure 6:
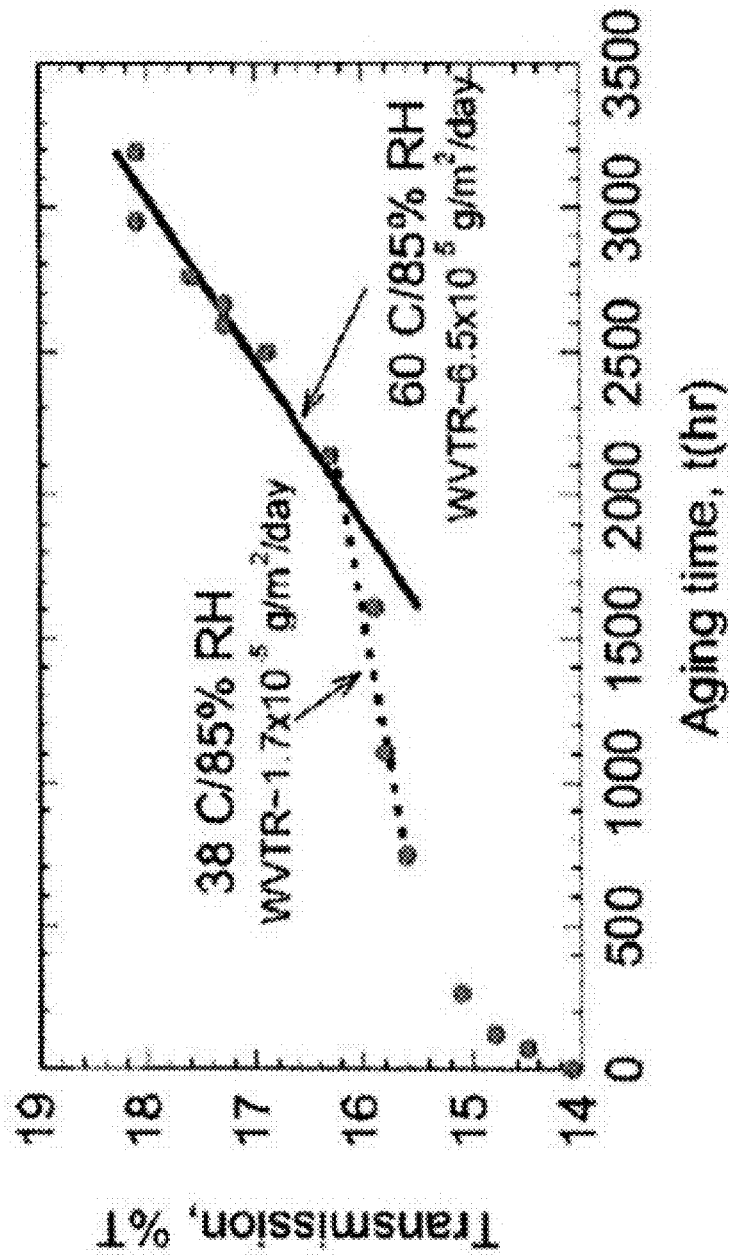
FIG. 6 provides data regarding aging effect on permeability for some thermal ground planes involve atomic layer deposition, in accordance with various embodiments.

In some embodiments, atomic layer deposition ("ALD") may provide for hydrophilic and hydrophobic coatings on the micro/nano-scaled wicking structures, due to the extremely low intrinsic thermal resistance of the nanoscale-thick coatings which can be (created/produced). To obtain a hydrophilic coating with small contact angle in water, some embodiments may apply ALD $SiO_2$ and $TiO_2$ coatings merely by way of example on the the wicking structures of the evaporator. For a hydrophobic coating on the condenser, ALD alkylaminosilanes polymer may be formed with covalent bonding to the hydroxyl groups on an ALD alumina layer, as shown in FIG. 5, attached to the nanorods/nanomeshes. The contact angle with water on a planar surface may be about 108° in some embodiments, and may reach 160° or larger for ALD superhydrophobic nanostructures. Moreover, ALD alumina coating may provide a water vapor barrier for some embodiments as shown in FIG. 6. Merely by way of example, a water vapor permeability may be $1.7 \times 10^{-5}$ gm/m$^2$·day in some embodiments, which is about 50,000× lower than the 1 gm/m$^2$·day for a typical polymer. The aging effect on the permeability as shown in FIG. 6 may be overcome by applying additional ALD SiO$_2$ or fluoropolymer on top of ALD alumina. Moreover, ALD coating may provide a corrosion protective coating that prevents liquid corrosion on the wicking structures.

In some embodiments, other thin film deposition techniques may be used besides and/or in addition to ALD. Merely by way of example, chemical vapor deposition ("CVD") techniques may be used in some embodiments. CVD techniques may include, but are not limited to, the following: atmospheric CVD, low-pressure CVD, ultrahigh vacuum CVD, aerosol assisted CVD, direct liquid injection CVD, microwave plasma-assisted CVD, plasma-enhanced CVD, remote plasma-enhanced CVD, atomic layer CVD, hot wire CVD, metalorganic CVD, hybrid physical-chemical CVD, rapid thermal CVD, and/or vapor phase epitaxy. Merely by way of example, physical vapor deposition ("PVD") techniques may be in used in some embodiments. PVD techniques may include, but are not limited to, the following: evaporative deposition, electron beam PVD, sputter deposition, cathodic arc deposition, pulsed laser deposition, ion assisted deposition, and/or ion plating. Other thin film deposition techniques that may be used in some embodiments also include electroplating, electrodeposition, thermal oxidation, sputtering, reactive sputtering, evaporation, casting, molecular beam epitaxy, vapor-phase epitaxy, liquid-phase epitaxy, solid-phase epitaxy, homoepitaxy, heteroepitaxy, and/or heterotopotaxy. In some embodiments, a lamination of a metal layer be utilized.

Embodiments may involve a polymer including liquid crystal polymer (LCP). Liquid crystal polymer may have low moisture permeability, which may provide for hermetic sealing for extremely low fluid loss in some embodiments. LCP may be used as an FTGP casing material in some embodiments. Polyimide material commonly used for fabricating flexible circuit boards can be good alternative to LCP.

Figures 7A, 7B:
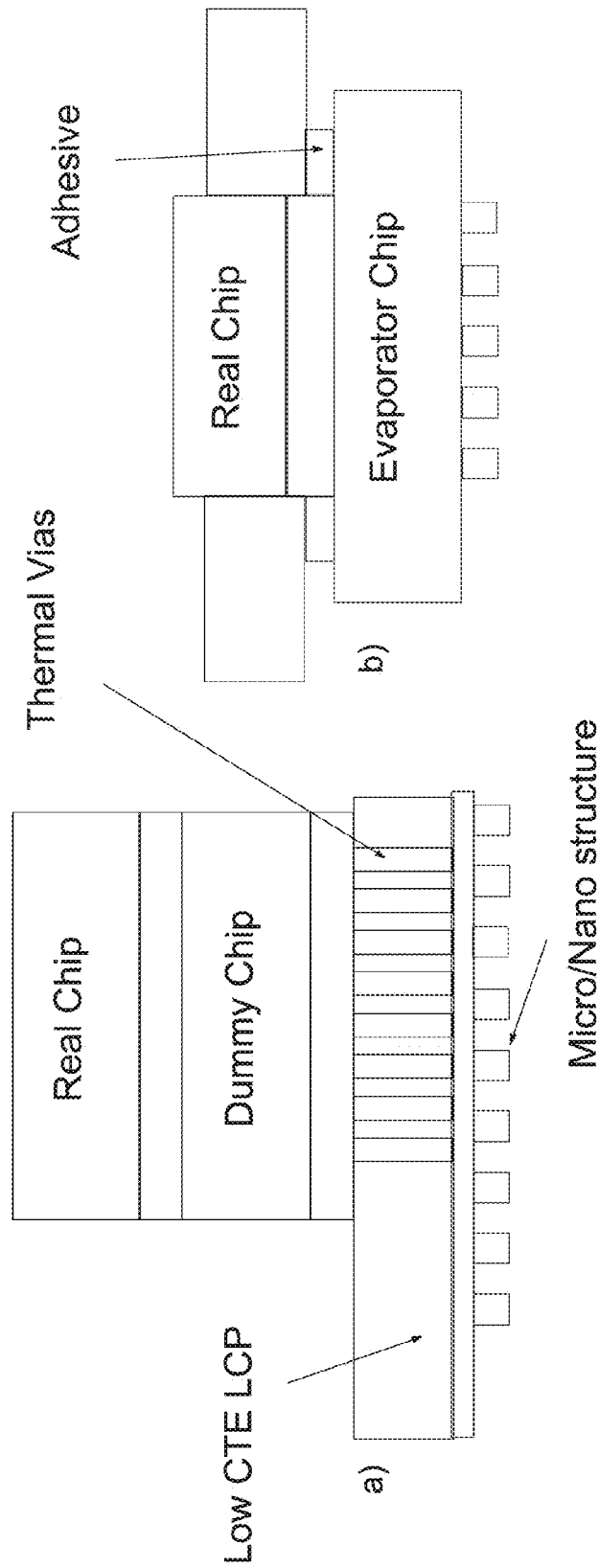
FIGS. 7A and 7B show different micro/nano-scaled evaporator structures fabricated on liquid crystal polymers, in accordance with various embodiments.

Merely by way of example, FIG. 7A shows an approach with the micro/nano-scaled evaporator structure fabricated on LCP, which includes a chip-on-chip configuration for thermally matched chip attached to LCP. The evaporator may be thermally connected to a dummy intermediate chip through thermal vias and copper pads. The effective coefficients of thermal expansion (CTE) of the dummy chip may be collectively influenced by the LCP and the chip attachment material. For high heat flux applications, embodiments may apply the configuration shown in FIG. 7B, in which the evaporator structure is fabricated on the real chip and may provide additional thermal performance.

FTGPs may be utilized with many different systems. Merely by way of example, FTGPs may be utilized with (a) laser modules representing high heat flux applications, (b) transmitter/receiver (T/R) modules representing high power applications, (c) power control boards representing folded flexible-circuits applications, and/or (d) concentrated solar power plants. FTGPs may be utilized with many other systems where thermal management is a concern as one skilled in the art will recognize Merely by way of example, the following may provide comparison of FTGP and state-of-the-art vapor chambers (also called flat heat pipes) reported by some vendors. The wicking structures of state-of-the-art vapor chambers may be made from sintered copper or other metals, merely by way of example. With the development of micro/nano hybrid wicking structure, FTGP's thermal conductivity may be at least 10× higher than those achieved in rigid vapor chambers today, with an order-of-magnitude weight reduction as well. The FTGP's heat flux may also reach as high as 1,000 W/cm$^2$ with a very dramatic thickness reduction, which would be an enabling technology for future military electronic devices and systems.

In addition, merely by way of example, the following table compares FTGP with some recent research on microscale flat heat pipes (vapor chambers). FTGP may outperform all these research systems as shown in Table 3.

TABLE 3

Comparison between FTGP and some Research Micro Flat Heat Pipes (Vapor Chambers)

| Ref | Hermeticity (% fluid loss/yr @100 'C) | Wicking (g, inertial force) | Wick Thermal Conductivity (W/mK) | Heat Pipe Thermal Conductivity (W/mK) | Thickness (mm) | Area (cm × cm) | Weight (gm) | Duration (hours) |
|---|---|---|---|---|---|---|---|---|
| 1 | N/A | 1 g | groove | 600 | 0.7 | 2 × 2 | N/A | N/A |
| 2 | N/A | 1 g | silver particle and mesh | 12,000 | 4 | 10.8 × 2.65 | N/A | N/A |
| 3 | N/A | 1 g | groove | 133 | 2 | 8 × 3 | N/A | N/A |
| 4 | N/A | 1 g | groove | 625 | 1.25 | 2.4 × 1.6 | N/A | N/A |
| 5 | N/A | 1 g | copper mesh | 157 | 6.35 | 12 × 1.27 | N/A | N/A |
| 6 | N/A | 1 g | Sintered column | 1050 | 1 | 6 × 2 | N/A | N/A |
| FTGP | 0.1 | 25 g | 100 | 30,000 | 1 | 20 × 40 | 50 | 1,000 |

FTGP may incorporate novel features: a hybrid micro/nano wicking structure as well as macro/micro/nano fabrication and assembly compatible with flexible circuit manufacturing technologies. The fabrication and assembly may include maskless fabrication of the hybrid micro/nano-scaled wicking structures using various nanofabrication templates, atomic layer deposition for hydrophilic, hydrophobic, hermetic and corrosion-protective coatings. These techniques and features are to be discussed next, followed by embodiments of different processing and assembly steps.

Figure 8:
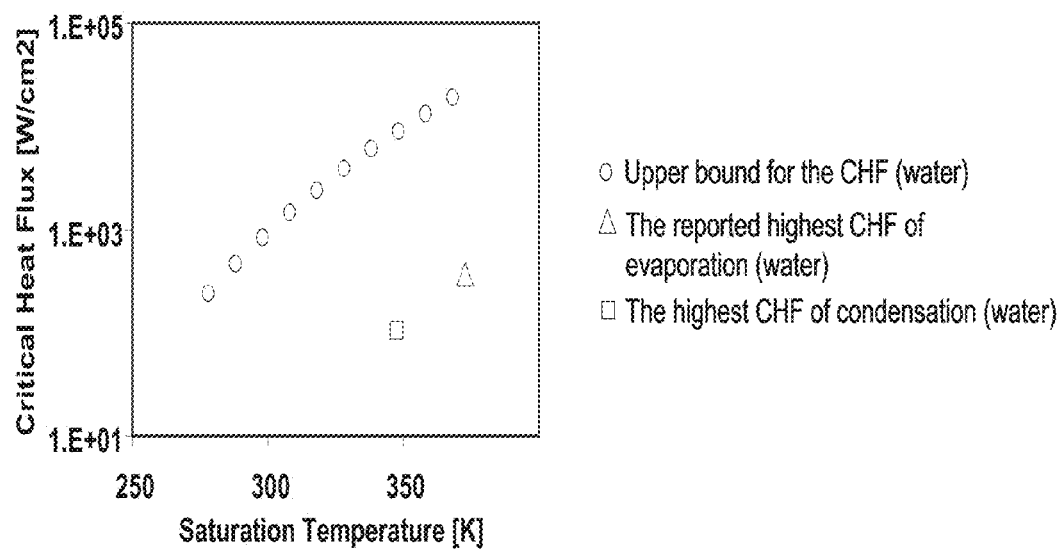
FIG. 8 provides some experimental data regarding critical heat fluxes regarding evaporation or condensation, in accordance with various embodiments.

Embodiments may provide an FTGP with a hybrid micro/nano wicking structure. Nanotechnology may enable the fabrication of billions or trillions of nanorods or nanomeshes to increase surface area tremendously and create an opportunity to improve the heat transfer performance of a thermal ground plane substantially. FIG. 8 may illustrate some physical limitations and some state-of-the-art experimental data of the critical heat flux that evaporation or condensation could achieve. The critical heat flux may be the maximum heat flux which the evaporator can sustain before burn out. The physical limitations may be estimated based on the kinetic theory; they are about 1000× higher than the ones reported, even with microstructures. There is large potential for improvement resulting from nanotechnology.

Figure 9:
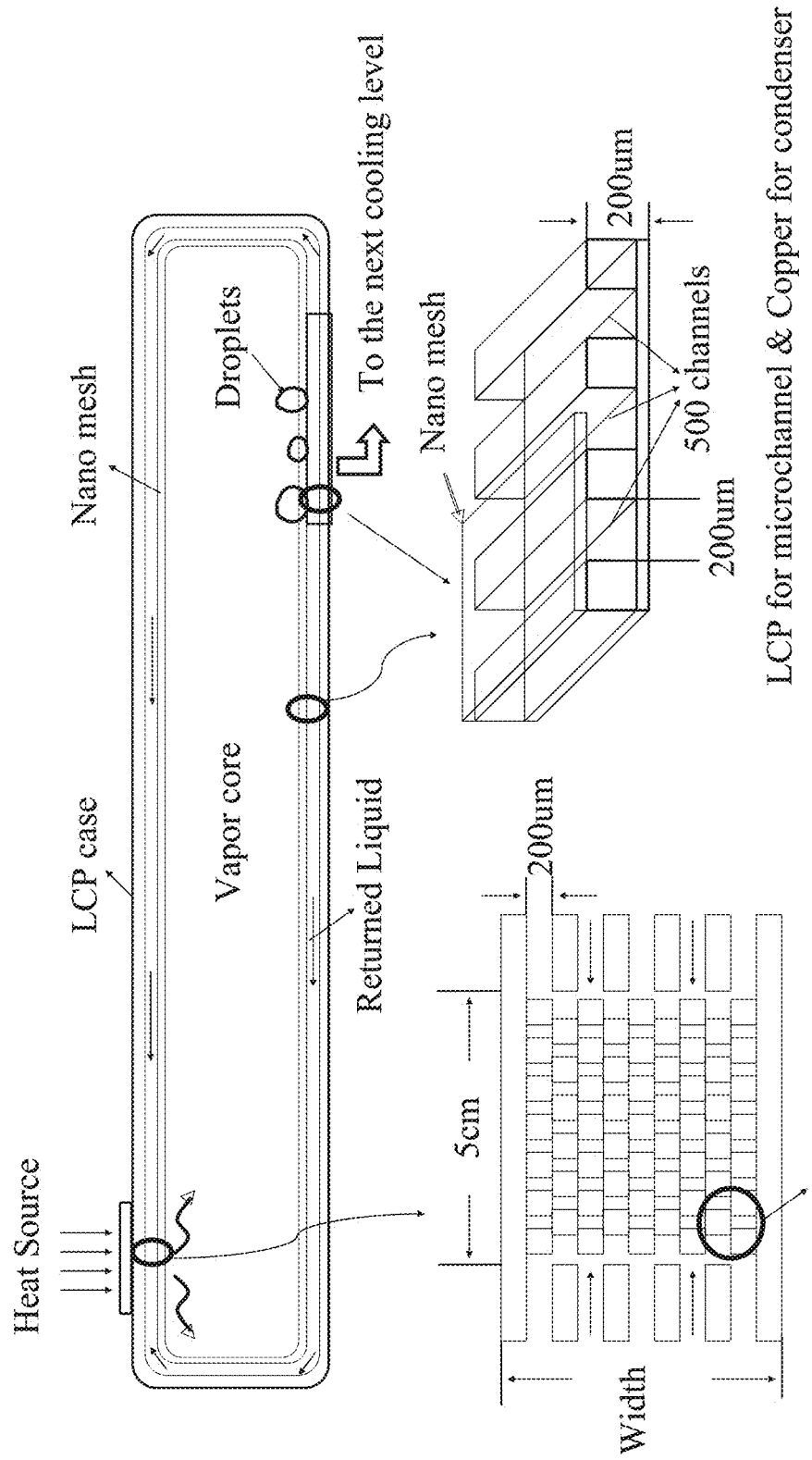
FIG. 9 shows a one-dimensional heat transfer model of a thermal ground plane, in accordance with various embodiments.

However, the performance of a thermal ground plane may not be governed by evaporation or condensation processes only. In some embodiments, the system's performance may actually be affected by many trade-off considerations. FIG. 9 shows a one-dimensional heat transfer model, merely by way of example, which includes the following two performance measures:

FTGP Thermal Conductivity=function of (size of nanomesh's opening, size of nanorods, size of microchannels, size of micro cubes, contact angles of hydrophilic and hydrophobic coatings, FTGP length and width, wick's thermal conductivity and thickness, and vapor core thickness)

FTGP Maximum Allowable Inertial Force for Effective Wicking=function of (size of nanomeshes opening, size of microchannels, size of micro cubes, contact angles of hydrophilic coating)

The condensed liquid may return to the evaporator through the microchannels. The evaporator, condenser, and microchannels may be covered by nanomeshes that separate the vapor flow from the liquid flow.

Figure 10:
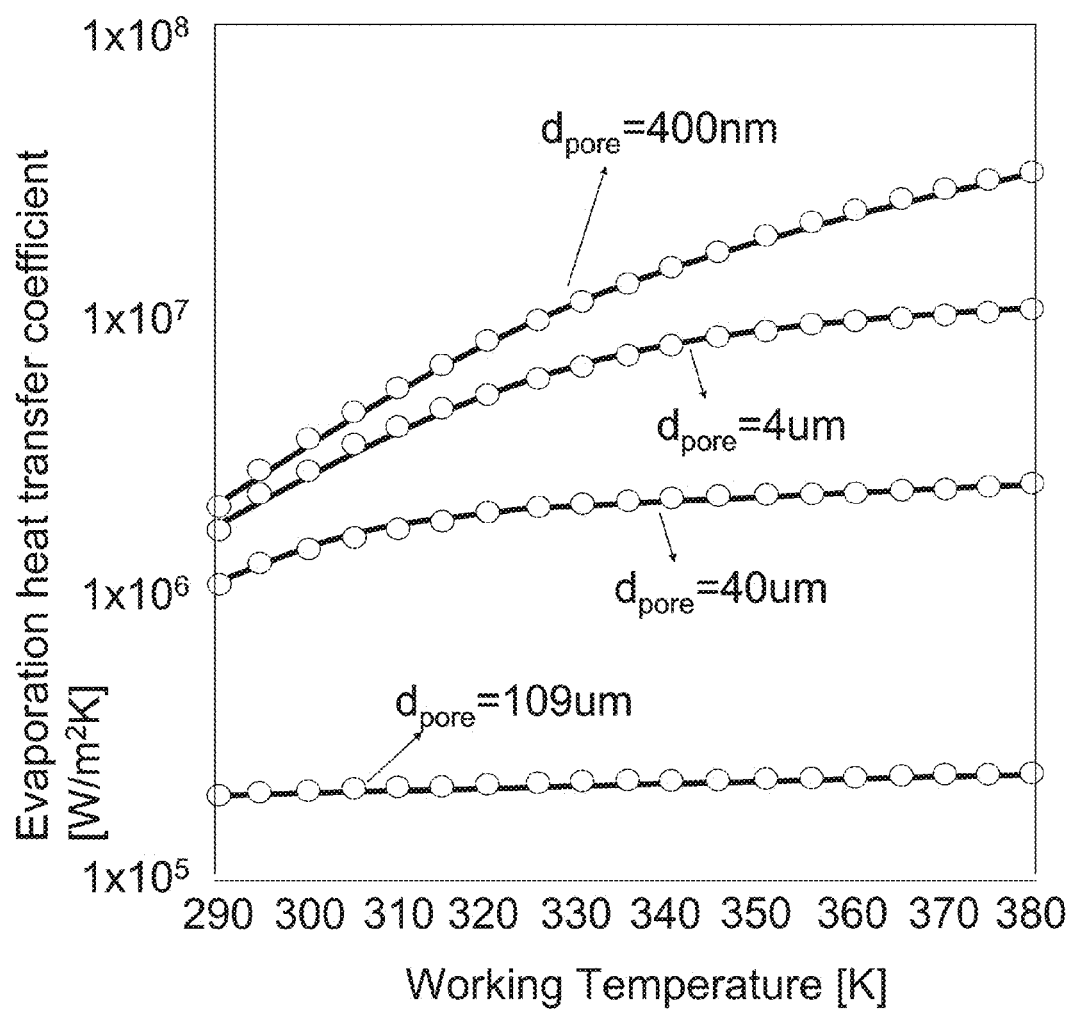
FIG. 10 provides some results regarding saturation temperature and evaporation heat trans coefficients, in accordance with various embodiments.

FIG. 10 presents some results for some embodiments, merely by way of example. FIG. 10 may indicate that nanomeshes with pore diameters of 400 nm would result in excellent evaporation for heat transfer coefficients ranging from 2,000 to 10,000 kW/m²K, which is about 10-100× higher than the state-of-the-art level. As shown in the figure, the smaller the pore size, the higher the evaporation heat transfer coefficients may be. However, there may be a limitation; boiling becomes unstable when the pore size approaches that of the vapor nucleation sites (~100 nm). In some embodiments, a 400 nm size may be used to assure excellent and stable evaporation.

Figure 11:
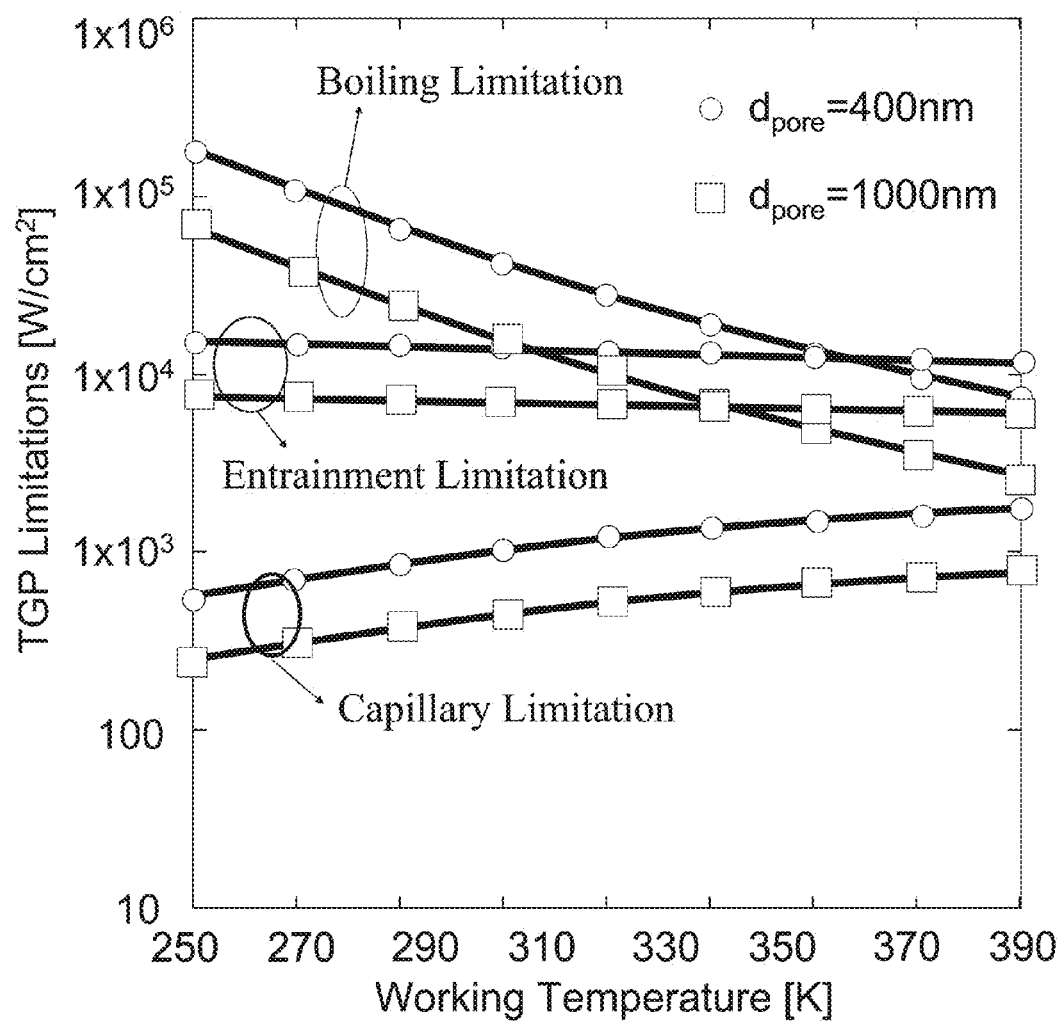
FIG. 11 provides heat flux data regarding evaporators, in accordance with various embodiments.

FIG. 11 may present the critical heat flux affected by three limiting factors of an evaporator: capillary pressure, boiling, and entrainment for some embodiments. In a nanostructure with $d_{pore}$=400 nm, for example, the critical heat flux may be enhanced significantly, reaching the level of 1000 W/cm². For some embodiments, this level may be limited by the capillary pumping pressure resulting from the nanostructure. For some embodiments, it may be further enhanced by reducing $d_{pore}$, the boiling limit may drop quickly when the size reaches that of nucleation sites.

For some embodiments, an evaporator's size may be governed by the chip size. Condenser area may be made to accommodate the FTGP's performance needs. The condenser's performance may affect total system performance; it may be adjusted as necessary. In some embodiments, dropwise condensation in the condenser may be emphasized, which may result in a heat transfer coefficient 30 times larger than film-wise condensation by using surface-coated hybrid micro/nanostructures.

FIG. 11 shows how critical heat flux of evaporators for some embodiments may be affected by three limiting factors: boiling, entrainment and capillary pressure. All the limits may be increased as the pore size decreases. Boiling may be limited by the bubble size associated with the pore size. In some embodiments, it may be stable since 400 nm is considerably larger than the size of nucleation sites. Entrainment may limited in some embodiments by the shear stress between the vapor flow and liquid flow as the operation heat flux increases. Capillary pressure may be limited in some embodiments by the pumping ability of the micro/nano hybrid wick to circulate the working fluids. Capillary pressure may determine the critical heat flux for some embodiments of an FTGP.

Figure 12A:
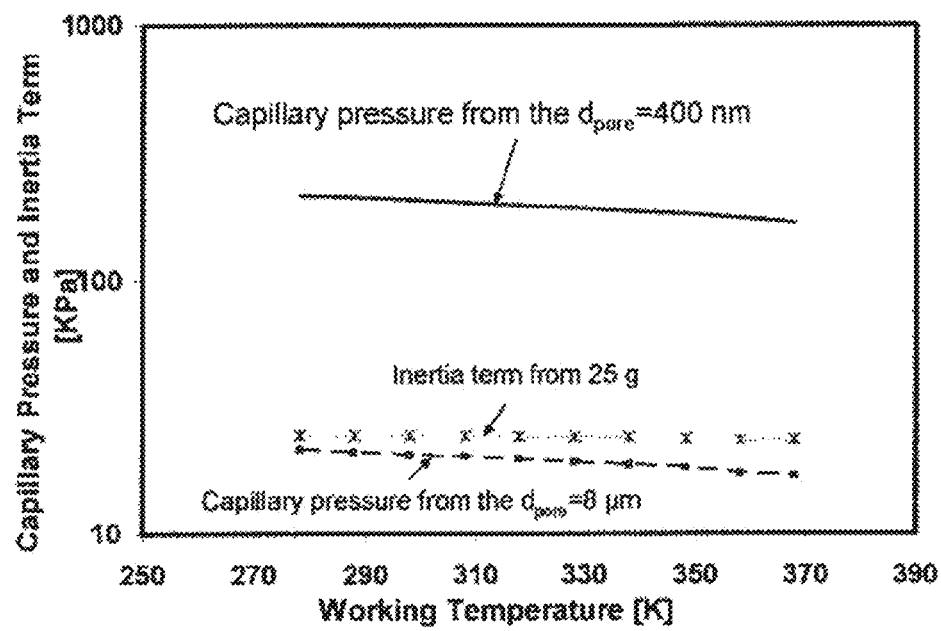
FIGS. 12A and 12B provide data regarding working temperatures and capillary pressures for some embodiments.

In a heat pipe for some embodiments, the liquid may be supplied by the capillary force difference between the evaporator and condenser. In order to obtain sufficient capillary pressure to assure a steady liquid supply under high-g acceleration for some embodiments, a nanoscale wick structure may be used. FIG. 12A may demonstrate that the wick structures should be smaller than 8 um to generate enough capillary pressure for the wick structure to remain operational under 25-g acceleration for some embodiments. The chosen 400 nm feature size may assure FTGP to pass an acceleration test, though other sizes may be utilized for other embodiments.

For some embodiments, the smaller the feature size, the better the performance may be. FIG. 12 show that microtechnology may be important for some embodiments along with nanotechnology. The flow resistance in terms of pressure drop may increase significantly when the copper cube's size is decreased from 50 to 10 µm. These copper cubes may be used in the evaporator to form channels supplying liquid to nanomeshes through their pores for some embodiments (see FIGS. 8 and 9, for example). The 50 µm cubes may be selected for FTGP embodiments because the associated pressure drop may be less than the capillary pressure induced by nanomeshes. These figures also illustrate a hybrid micro/nano wicking structure for some embodiments. A nano structure may be desirable for evaporation and condensation heat transfer for some embodiments. However, a micro structure may minimize the flow resistance for some embodiments.

Figure 12B:
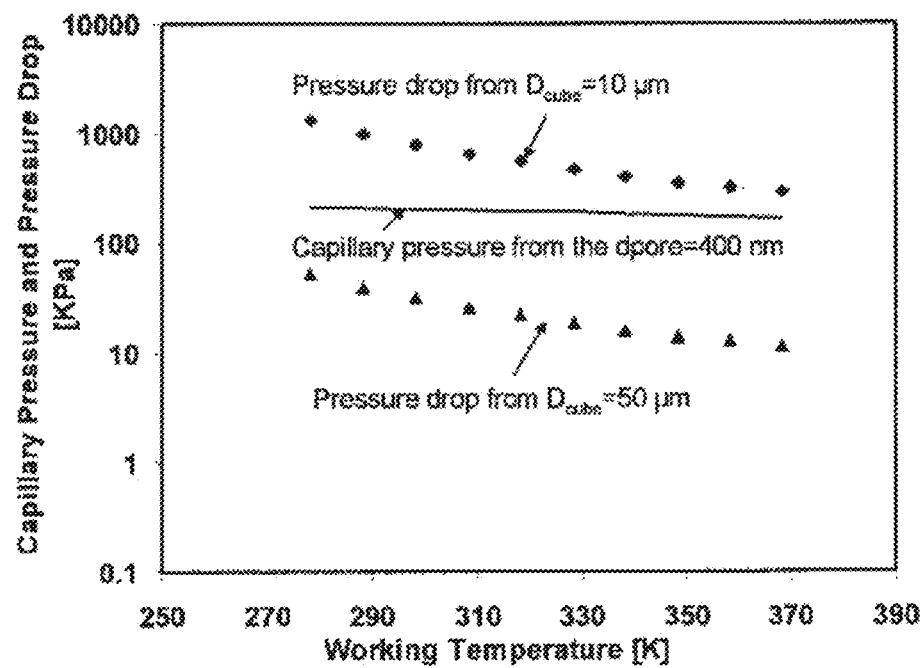

FIG. 12A shows for some FTGP embodiments to remain operational at 25 g acceleration, the capillary force may be generated by pores with a diameter less than 8 um. It also shows that the pore size of 400 nm selected for nano-evaporation may generate enough force to overcome the 25 g acceleration. FIG. 12B provides illustration of the magnitudes of capillary pressure generated by 400 nm pore and pressure drop (flow resistance) for some embodiments resulting from micro structures. The flow resistance may be inversely proportional to the size of the copper cubes, $\Delta p \sim 1/D_{cube}^2$. For some embodiments, changing from 50 to 10 µm cubes, the resistance may increase by 10×. It also shows that the capillary pressure generated by 400 nm pores may overcome the flow resistance in micro pores with diameter much larger than 10 um for some embodiments. These figures may show that hybrid micro/nano-scaled wicking structure may be used for some embodiments.

Figures 13A, 13B:
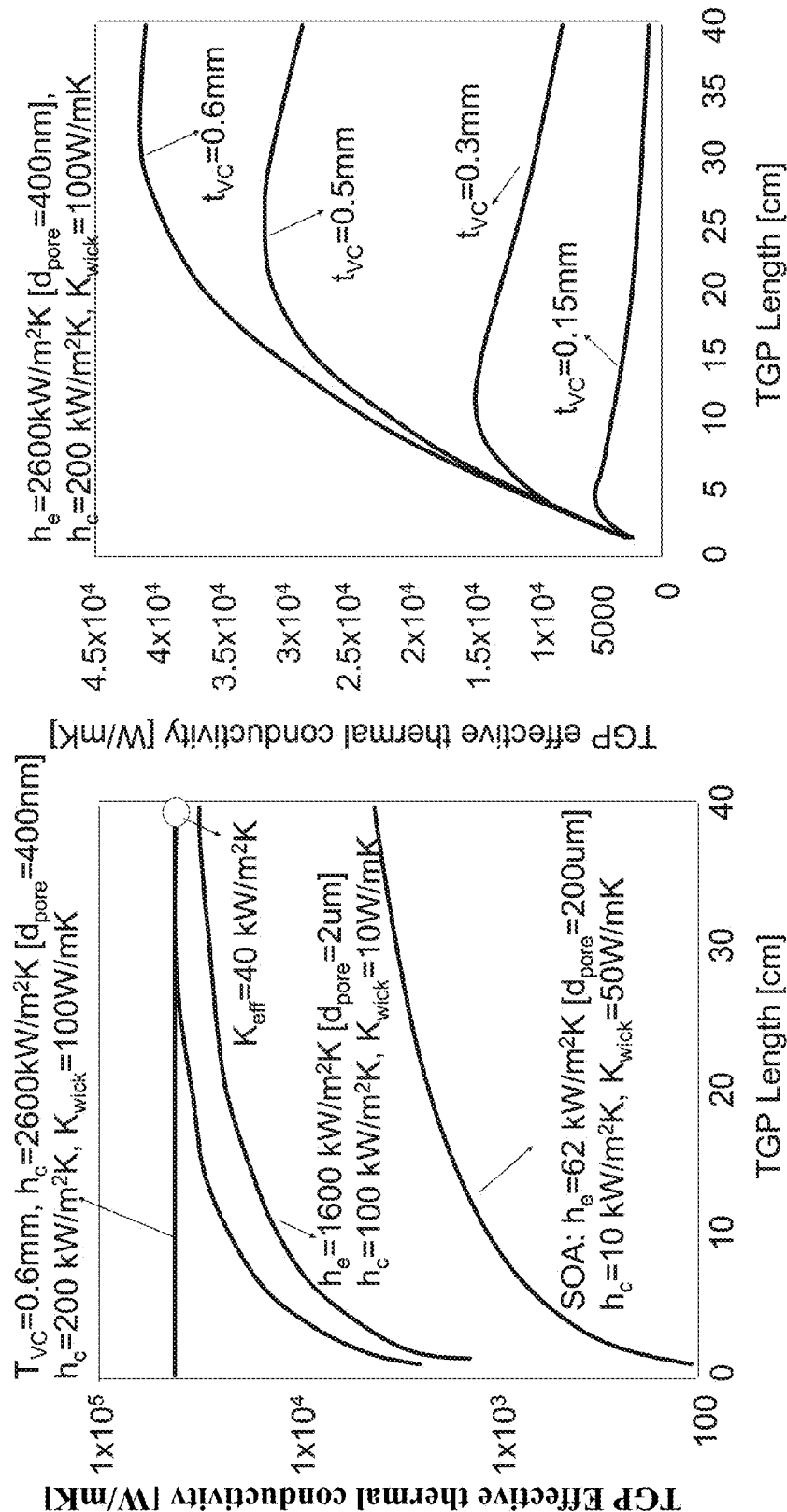
FIGS. 13A and 13B provide information regarding thermal conductivity as function of length for some embodiments.

For some embodiments, FIGS. 13A and 13B may show FTGP thermal conductivity as a function of its length. Merely by way of example, thermal conductivity may reach 40,000 W/mK with a 40 cm length and 0.6 mm vapor core thickness for some embodiments. Merely by way of example, some embodiments may have a thermal conductivity of 30,000 W/mK with $h_e$=2500 kW/m²K. Effective thermal conductivity may be a function of length. For some embodiments, a thermal conductivity for a specific purpose may thus be determined by length.

In addition to the length effect, FTGP thermal conductivity may also be affected by the thickness of vapor core for some embodiments. FIG. 13-b may show the effect of thickness. The vapor core thickness may play a role in governing the overall performance of FTGP. The vapor pressure may drop between the evaporator and the condenser for some embodiments may become more sensitive to vapor core thickness when the FTGP is longer than 5 cm. For some embodiments, a higher pressure drop may result in a higher temperature drop and hence brings much lower thermal conductance during the process of vapor transportation from the evaporator to condenser. Merely by way of example, when the vapor core is reduced to 0.15 mm, the maximum performance of FTGP may be 5148 W/mK. For some FTGP embodiments, the vapor core thickness may be larger than 0.5 mm.

Tin some embodiments, the capillary pressure resulting from evaporation may be enhanced 800×. by this wicking structure for some embodiments. The flow resistance may increase due to the use of micro cubes; however, for some embodiments, this may be mitigated by only using 50 μm cubes in the evaporator region. In other regions, 200 microchannels may be used and their pressure drop may be small. For heat removal capability, a micro/nano structure may enhance the surface area, increasing the evaporator's effective heat transfer coefficient by 500×. for some embodiments.

Embodiments also provide methods for fabrication and assembly of FTGP compatible with different circuit manufacturing, including but not limited to flexible circuit manufacturing. Some embodiments may involving the following: a) diblock copolymer for the maskless fabrication of the hybrid micro/nano-scaled wicking structure, b) atomic layer deposition for hydrophilic, hydrophobic and hermetic coatings, and c) matching of coefficients of thermal expansion (CTE) with a liquid crystal polymer (LCP) substrate that is selected as the casing material for FTGP.

Figure 14:
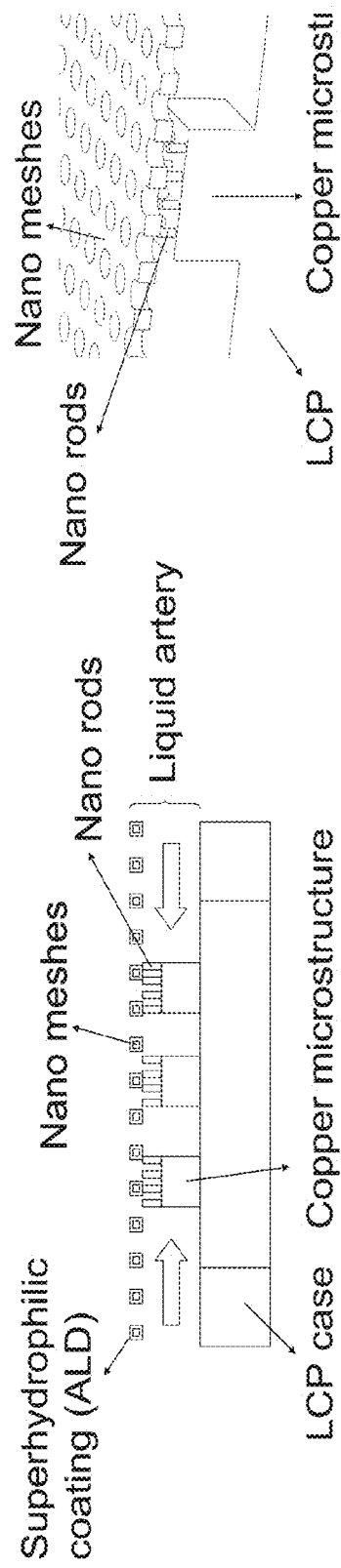
FIG. 14 shows some structural and property features of a thermal ground plane, in accordance with various embodiments.

Some embodiments may involve maskless fabrication of hybrid micro/nano-scaled wicking structure. In some embodiments, nanorods and nanomeshes covering the micro-scaled features may be utilized with micro/nano wicking structure. FIG. 14 may show structural and property features for some embodiments. FIG. 14 may include a hybrid micro/nano wicking structure that may be fabricated by a process compatible with flexible circuit manufacturing. Some embodiments may feature wick thermal conductivity. Fabricating hybrid micro/nanostructures directly out of copper or other metal or thermally conductive material may ensure good contact between the micro and nanostructures, in addition to its intrinsic high thermal conductivity (K=400 W/m K) for some embodiments. Merely by way of example, with a reasonable porosity (<0.6), embodiments may achieve $K_{wick}$=100 W/m K. Some embodiments may involving creating a micro/nano-scaled structure to assure reliable heat pipe operation under 25 g acceleration. Merely by way of example, a structure with 50 μm microcubes and 400 nm nanomeshes may generate pressure sufficient to overcome the pressure load resulting from the 25-g acceleration, anywhere from room temperature up to 80° C. Some embodiments, merely by way of example, may achieve 2,500 kW/m$^2$K for the evaporator's heat transfer coefficient. The liquid may flow through the microcubes to nanomeshes so that the phase change phenomena can happen on top of the microcubes. For some embodiments, nanorods between microcubes and nanomesh, shown in FIG. 15, may supply a liquid.

However, it may be challenging to fabricate nano-scaled features on micro-scaled features while being compatible with flexible circuit manufacturing, in which 25 μm lines/ spacings may be typically the smallest features possible. Diblock co-polymer may be used in some embodiments to address this challenge.

For some embodiments, a block copolymer molecule may contain two or more polymer chains attached at their ends and can self-assemble to form a nanoscale structure with a microdomain. Block copolymer films may be prepared by the spin-coating technique. The film thickness and the surface roughness may be controlled through the spin speed, the concentration of the block copolymer solution or the volatility of the solvent. The volume fraction of the components, the rigidity of the segments in each block, the strength of the interactions between the segments, and the molecular weight may contribute to the size, shape, and ordering of the microdomains.

Figure 15:
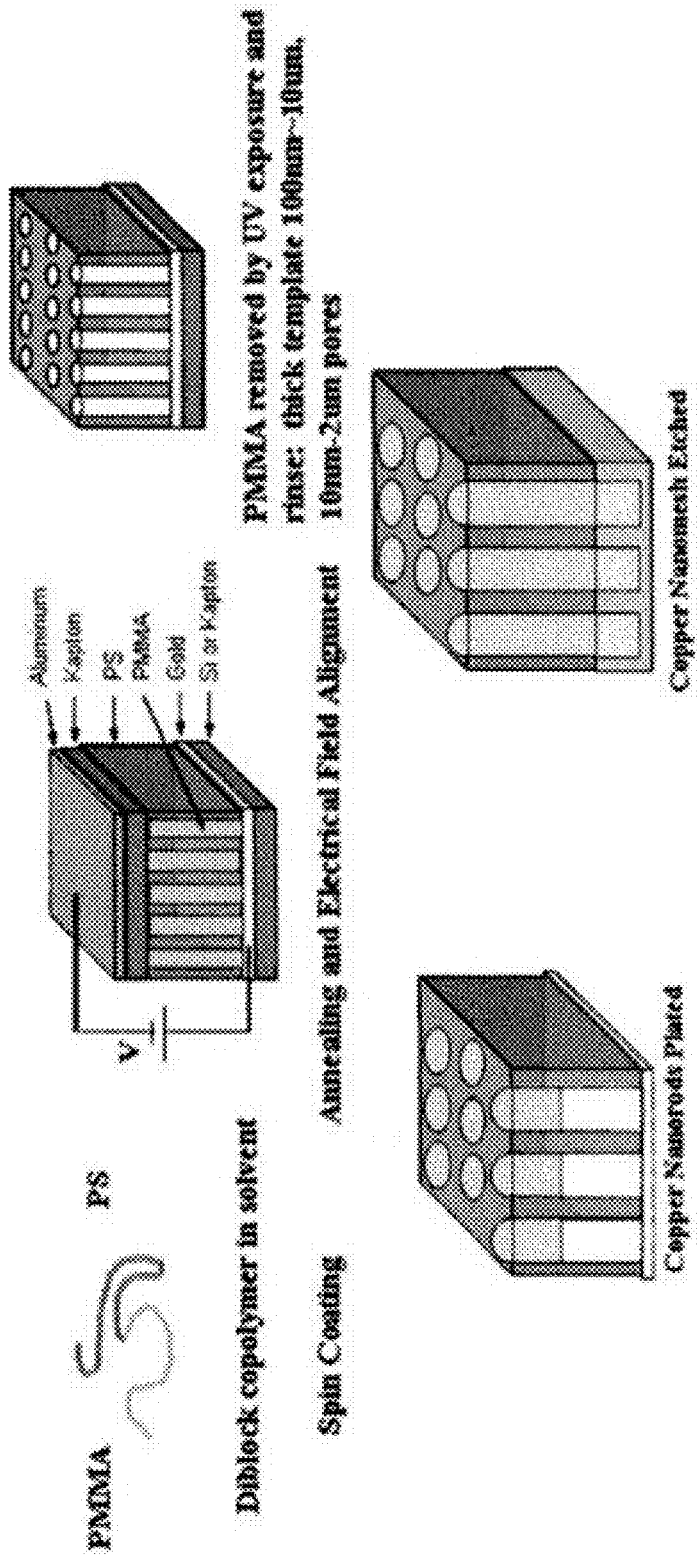
FIG. 15 shows aspects of some thermal ground planes, in accordance with various embodiments.

For some embodiments with micro/nano wicking structure, diblock copolymers composed of polystyrene and polymethylmethacrylate, denoted P(S-b-MMA), may be applied to form a rich variety of nanoscale periodic patterns and to offer the potential to fabricate high-density arrays. PS-b-PMMA is known to be stable, compatible with current photolithography processes and amenable to multilayered device fabrication. FIG. 15 shows the fabrication process of nanorods using diblock copolymers that may be used for electroplating copper nanorods with etching copper nanomeshes, for some embodiments. After spin-coating, Poly (methyl methacrylate) (PMMA) and polystyrene (PS) may be annealed and electrically aligned. The PMMA molecules may then removed by UV exposure and rinse. Merely by way of example, the pores remaining may be in the range between 10 nm and 2 um. Process optimization may be conducted to reach the target dimension of ~30 nm for the nanorods and ~400 nm for the nanomeshes for some embodiments. The co-polymer template may then be used as a mask to etch nanoscaled features or for electroplating.

Some embodiments may involve Atomic Layer Deposition (ALD) for Hydrophilic, Hydrophobic and Hermetic Coatings. For some embodiments, ALD may be important to the hydrophilic and hydrophobic coatings on micro/nano-scaled wicking structures due to its nanoscale thickness for extremely low intrinsic thermal resistance. Merely by way of example, for the hydrophilic coating's expected ~0° contact angle in water, the self-assembled monolayer may have hydrophillic functionality using polar chemical groups such as —OH or —(OCH2CH2)n OH [PEG]. ALD SiO2 and TiO2 coatings may then be applied on nanorods/nanomeshes of the evaporator for some embodiments.

ALD alkylaminosilanes polymer may be formed with covalent bonding to the hydroxyl groups on an ALD alumina layer (see FIG. 5, for example) attached to the nanorods/nanomeshes for some embodimetns. This ALD process developed for MEMS may provide advantages over self-assembled monolayer. Merely by way of example, the contact angle with water on a planar surface may be about 108° and can be more than 160° for ALD superhydrophobic nanostructures. Moreover, ALD alumina coating may provide an excellent water vapor barrier for some embodiments (see FIG. 6, for example). The water vapor permeability may be $1.7×10^{-5}$ gm/m$^2$ day, which is about 50,000× lower than the 1 gm/m$^2$ day for a typical polymer.

For some embodiments, ALD hydrophilic, hydrophobic and hermetic coatings may be used. Aging effects on the permeability may be shown in FIG. 6. The ALD alumina may be slowly damaged by the liquid water and high humidity moisture in some embodiments. However, ALD SiO$_2$ may survive in such an environment. Additional ALD SiO$_2$ or fluoropolymer on top of ALD alumina may be used to for some embodiments.

Figure 16:
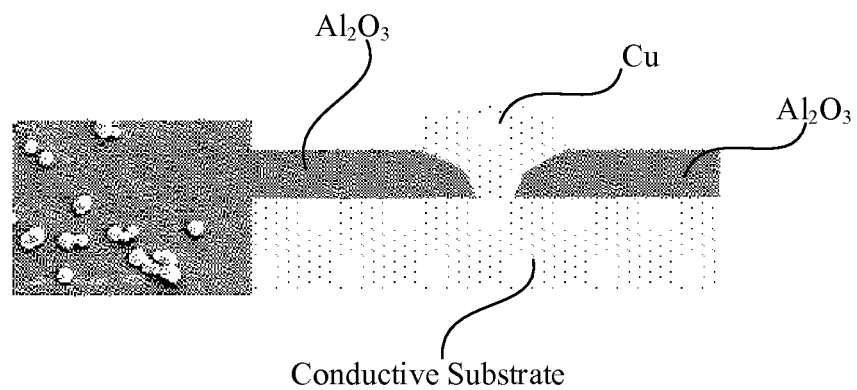
FIG. 16 shows defects that may be identified for some thermal ground planes that include atomic layer deposition, in accordance with various embodiments.

Producing high quality ALD coatings over copper surfaces may have challenges. As shown in FIG. 16, many defects may be identified by electroplating copper onto an ALD-alumina-coated over a copper surface. Copper surfaces may oxidize quickly. For some embodiments, ALD-on-copper coating may see a reduction in the defect density by at least 1000×. FIG. 16 shows defects that may be identified from ALD-alumina-coated copper.

For some embodiments, liquid crystal polymer (LCP) may be used as a casing materials for FTGP. LCP may have low moisture permeability, which is good for the hermetic sealing needed to assure extremely low fluid loss. Polyimide material commonly used for fabricating flexible circuit boards can be good alternative to LCP.

Referring back to FIG. 7, this shows embodiments with the micro/nano-scaled evaporator structure fabricated on LCP for some embodiments. An evaporator may then be thermally connected to an intermediate dummy chip through thermal vias and copper pads. The effective CTE of the dummy chip may be collectively influenced by the LCP, the copper vias, and the chip attachment material. For some applications, thermal vias and the dummy chip's die attachment may be too thermally resistive. In such cases, one may apply a configuration with the evaporator structure directly fabricated on the dummy chip for some embodiments (see FIG. 7-b) with excellent thermal performance. This chip may be attached to the LCP flexible circuit for some embodiments.

FIG. 17 shows embodiments of a finite element model in a test case with GaAs attached to a copper pad, which is to be fabricated on the LCP substrate. FIG. 17A shows a 3-D structure of chip-on-chip-on copper/LCP. FIG. 17B shows a finite element modeling conducted for dummy chip on copper structure. FIG. 17C shows a deformation of the dummy-epoxy-copper (structure/stack) (deformation is not to scale. The table below may demonstrate that the effective CTE of the GaAs dummy chip may be matched through structure design and materials selection using epoxy or solder. In some embodiments, CTEs of GaAs dummy chip may be attached to a copper pad through Au80Sn20 solder and epoxy and CTE matches between the dummy and the real GaAs. chips Some embodiments may involve different fabrication and assembly steps including the following: I) integration of micro structures (thermal vias, microcubes in evaporators and condensers, and microchannels for liquid flow path) and flexible circuit with copper microstructures; II) nanostructure fabrication using diblock copolymer template; III) ALD hydrophilic coating on evaporators and ALD selective hydrophobic coating on condensers; and IV) assembly process.

Figure 18:
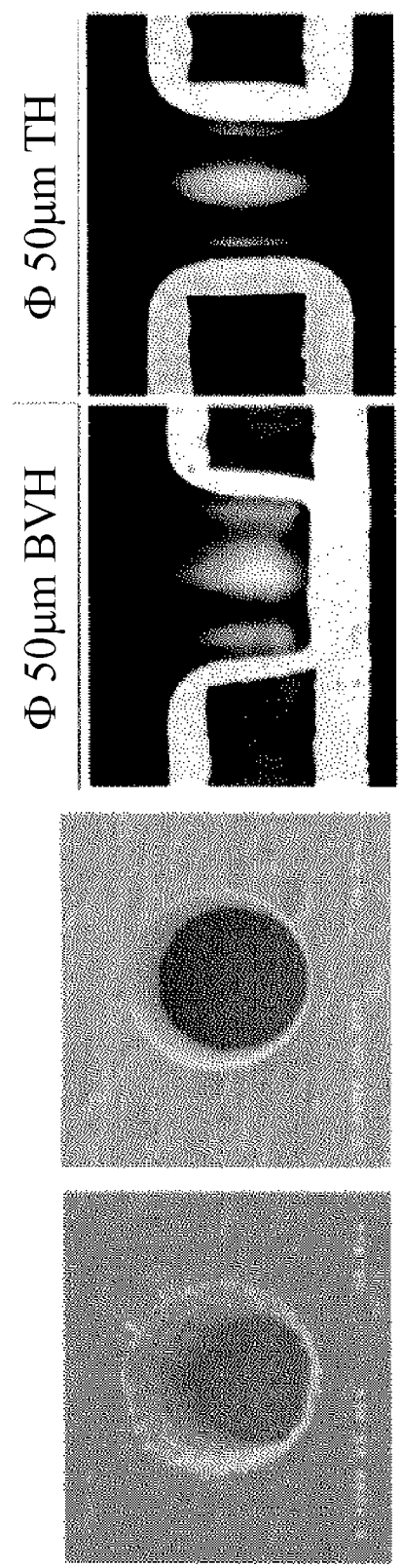
FIG. 18 shows aspects of some fabrication of thermal ground plane involving copper through hole vias, in accordance with various embodiments.

Some fabrication and assembly embodiments may involve a stage involving LCP flexible circuit with copper microstructures. Merely by way of example, flexible circuit vendors may provide fast and flexible design of liquid crystal polymer (LCP) substrates with copper through-hole vias and copper microstructures and multilayer flexible circuits. For some embodiments, copper through-hole vias may be processed by laser drilling and subsequent electroplating, as shown in FIG. 18. For multi-function circuit applications, multi-layer LCP structures may be finished by hot oil press or autoclave.

Figure 19A:
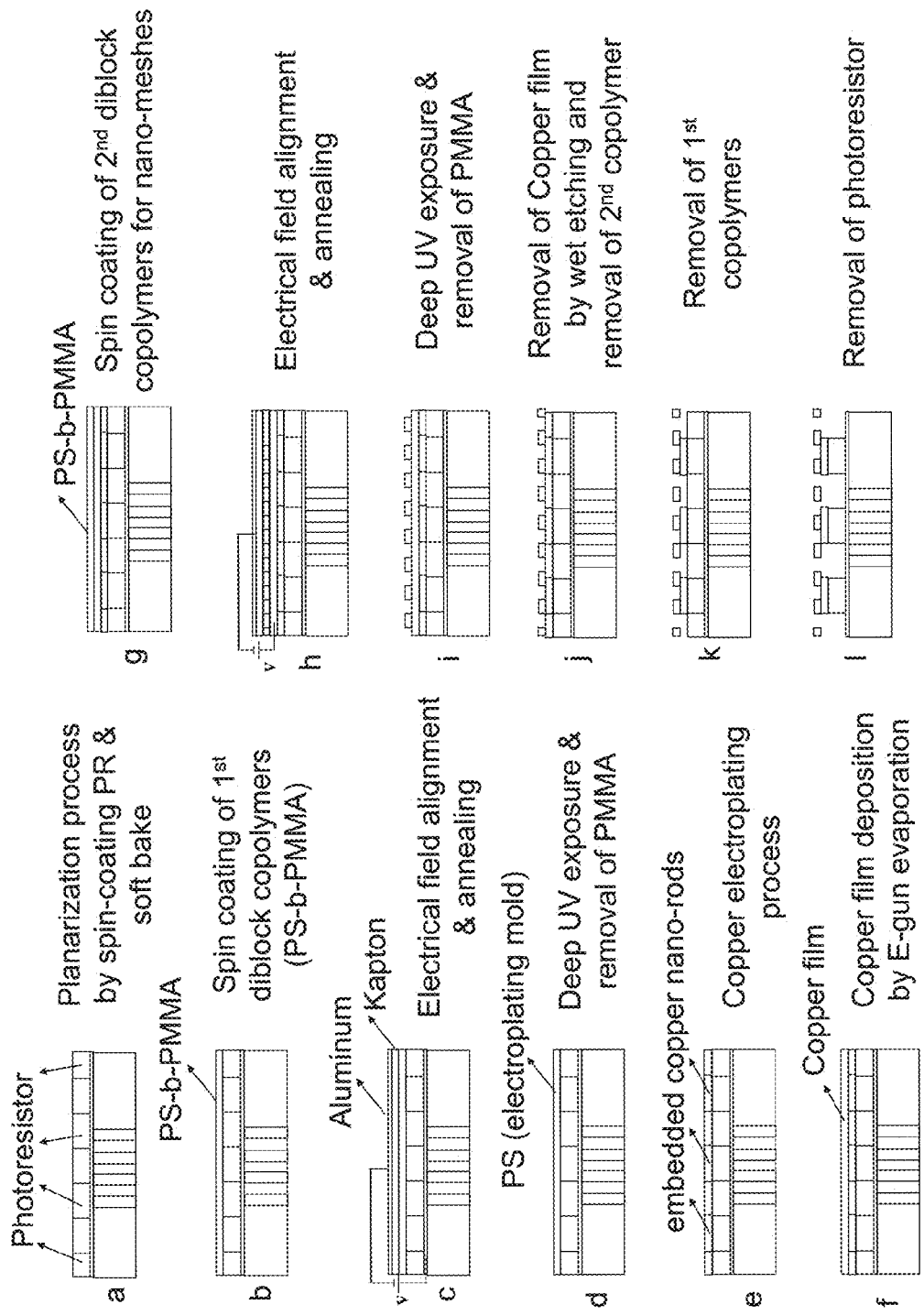
FIGS. 19A and 19B show methods of fabrication of thermal ground planes, in accordance with various embodiments.

Some fabrication and assembly embodiments may involve a stage involving nanowick fabrication. For some embodiments, with a LCP substrate, a block copolymer template may be used to achieve high density nanorod and nanomesh structures in the condenser and evaporator. To fabricate the designed micro/nanostructures as shown in FIG. 14, one may advantage of the following attributes of co-polymer templates: 1) the size of the nanostructures can be controlled by the ratio of the copolymers and 2) the co-polymer template can be used for both etching and deposition masks. The first copolymer template may be used to electroplate copper nanorods and then use the second copolymer template to etch the copper nanomeshes. The sizes of rods may be controlled and optimized. Detailed Stage II processes for some embodiments are shown in FIG. 19A.

FIG. 19-a shows a method of fabrication process of copper nanomeshes on copper micro structures using co-polymer templates for some embodiments. The process may use the first copolymer template to electroplate copper nanorods and then uses the second copolymer template to etch the copper nanomeshes. The feature sizes may be controlled and optimized.

The method of fabrication process of copper nanomeshes on copper micro structures using co-polymer templates for some embodiments shown in FIG. 19-a. The method may include a planarization process by spin-coating photoresists and then soft baking at Stage II-a. The method may include spin coating of $1^{st}$ diblock copolymers (PS-b-PMMA, for example), at Stage II-b. At Stage II-c, electrical field alignment and annealing may occur. Deep ultraviolet exposure and removal of PMMA may occur at Stage II-d. At Stage II-e, electroplating of copper nanorods may occur. Copper film deposition by E-Gun evaporation may occur at Stage II-f. Spin coating of $2^{nd}$ diblock copolymers (PS-b-PMMA, for example) for nano-meshes may occur at Stage II-g. Stage II-h may include electrical field alignment and annealing. Deep ultraviolet exposure and remove of PMMA more occur at Stage II-i. Removal of copper film by wet etching and removal of $2^{nd}$ copolymer may occur at Stage II-j. Removal of $1^{st}$ copolymers may occur at Stage II-k. And removal of photoresistor may occur at Stage II-l.

Figure 19B:
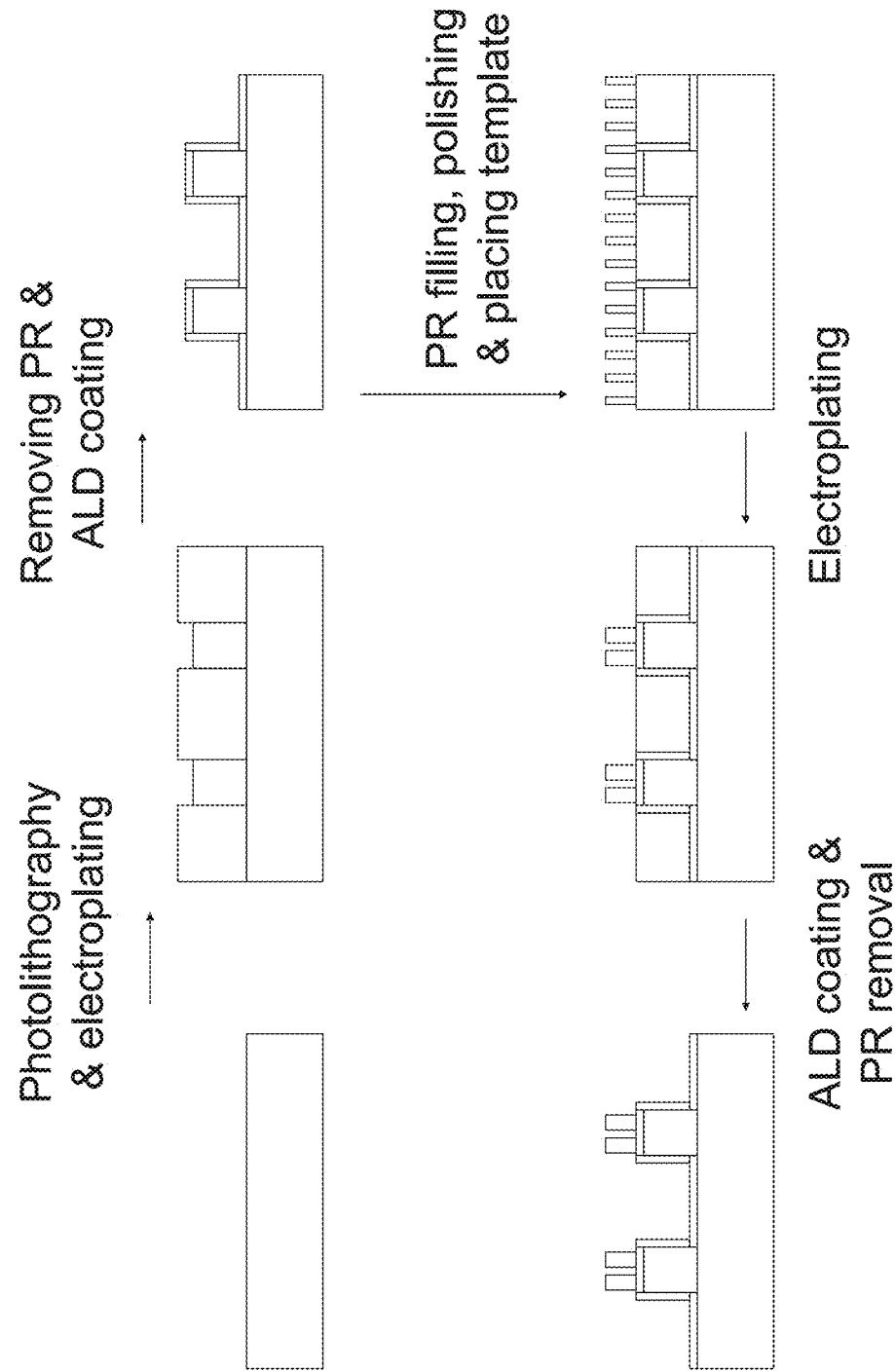

FIG. 19B shows another method of fabrication process involving hybrid copper micro/nano structures. The copper micro/nano-wicking structure may be fabricated by integration the photolithography and porous anodic alumina (PAA) template techniques, as shown in FIG. 19-b. Photoresist (PR) with designed micro-pattern may be created on the top of copper plate by using the photolithography process, and then the copper can be filled into these micro-pores by electroplating to obtain the ordered copper micro-pillars. The size of micro-pillars may be relative to the photolithography mask size, and the length of Cu pillars can be controlled by adjusting the electro-plating time. After removing the photoresist in acetone, atomic layer deposition (ALD) coating of a thin $Al_2O_3$ layer and subsequent absorbing FOB(DMA)S chains may be applied on the surface of as-prepared copper micro-pillar arrays, which could lead to the formation of hydrophobic surface. Then, photoresist may be spin-coated again to fill the gap between copper micro-pillars, and a flat surface can be obtained after the polishing process. By placing the PAA template on the top of these Cu microchannels and electroplating, free-standing Cu nanowire arrays can be fabricated just on the copper micro-pillars because of the confinement of PAA nanochannels for some embodiments. In the place of photoresist, no copper nanowire may be formed due to its electrical insulation. The as-obtained copper nanowire arrays may be modified to be hydrophilic by coating a thin layer of $TiO_2$ using ALD process. The copper micro/nanowicking structure with separated hydrophobic and hydrophilic surface may be obtained.

Figure 20A:
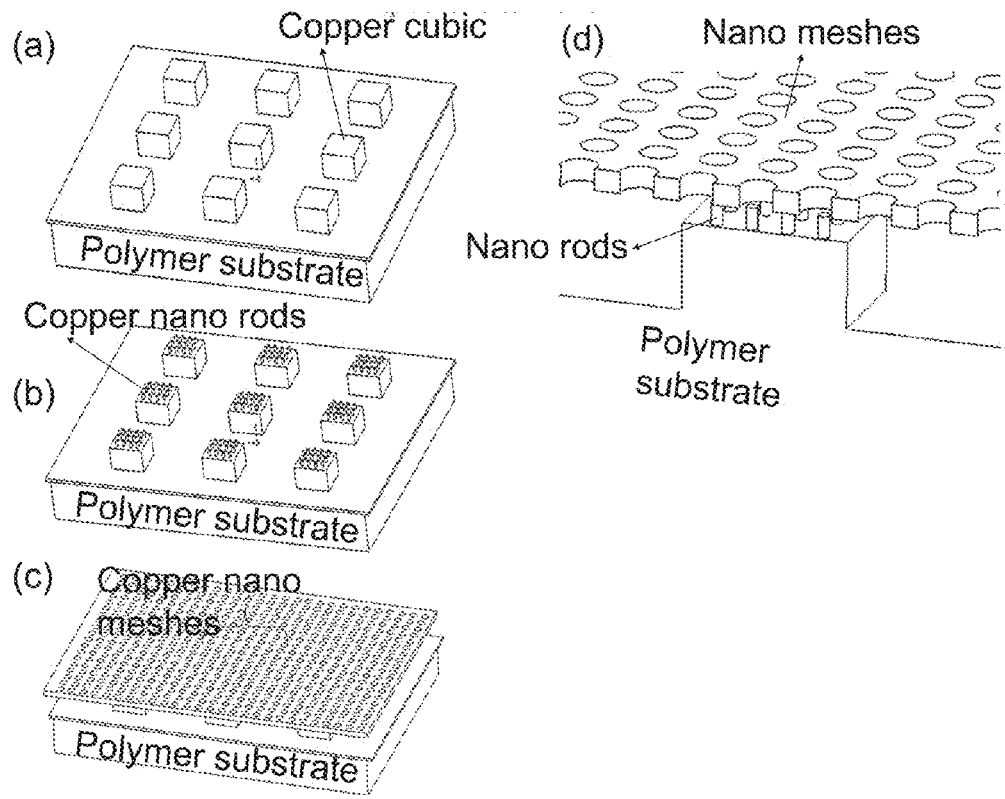
FIGS. 20A and 20B show micro/nano wicking structures, in accordance with various embodiments.
Figure 20B:
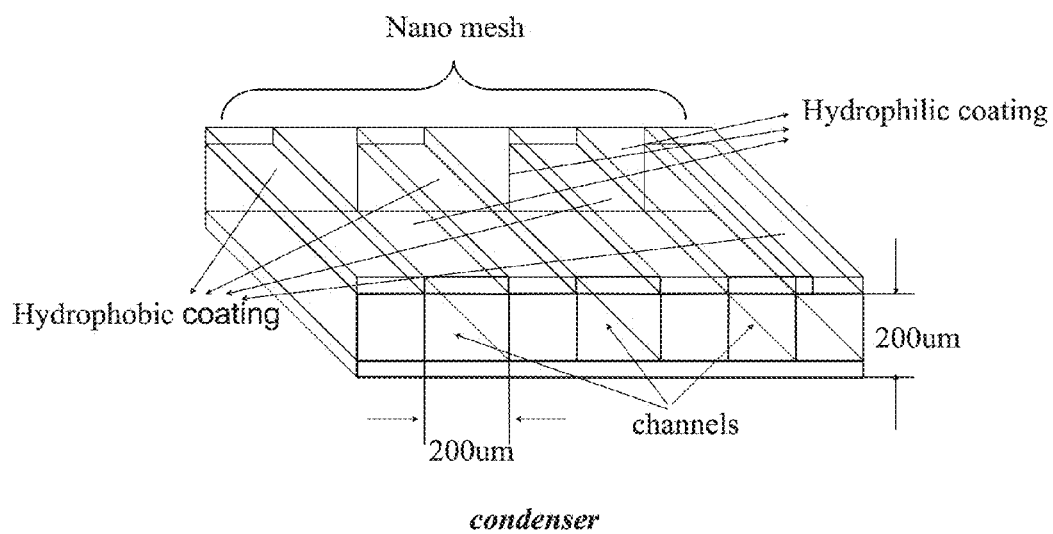

FIG. 20 illustrate the product after Stage I and Stage 2 for some embodiments. A microcube matrix in the evaporator and condenser (results of Stage I) may ensure a continuous liquid supply with low flow friction resistance both vertically and laterally. Fabricating a continuous nanomesh may sustain in a micro-porous environment, ensuring appropriate operation under high g acceleration and orders of magnitude enhancement in phase change heat transfer for some embodiments. Obtaining evaporation or condensation at the microcubes may ensure low thermal resistance from case to phase-change site. This may be achieved by an intermediate nanorod layer between the microcubes and the top nanomesh layer, which may assure flow continuity from the phase-change front at the evaporator and condenser (results of Stage 1) may ensure a continuous liquid supply with low flow friction resistance both vertically and laterally. Fabricating a continuous nanomesh may sustain in a micro-porous environment, may ensure appropriate operation under high g acceleration and orders of magnitude enhancement in phase change heat transfer. Obtaining evaporation or condensation at the microcubes may ensure low thermal resistance from case to phase-change site. This may be achieved by an intermediate nanorod layer between the microcubes and the top nanomesh layer, which assures flow continuity from the phase-change front at the nanostructures to the microwicks for some embodiments. FIG. 20A shows micro/nano wicking structure for a super-hydrophilic evaporator. FIG. 20B shows a micro/nano wicking structure for selective ALD hydrophobic/hydrophilic coating.

Some fabrication and assembly embodiments may involve a stage involving ALD hydrophilic coating on evaporators and ALD selective coating on condensers. After hybrid micro/nano wick structures are fabricated, nanoscale-thickness ALD coatings which offer extremely low intrinsic thermal resistance may be coated on the wick structures. ALD alumina may be coated to cover every feature first for inner hermetical seal. ALD $SiO_2$ or $TiO_2$ hydrophilic coatings may then be applied. For the condenser, ALD hydrophobic coating may be applied with a pattern shown in FIG. 20-b. Such a pattern may promote dropwise condensation on the hydrophobic sites and quickly remove droplet through hydrophilic wicking. Selective ALD coating may be accomplished using photoresists or other sacrificial layer to cover unwanted regions. ALD may be coated at a temperature as low as 50° C., so we will have many options for the sacrificial materials.

Additional stages may involve fabrication of hybrid micro/nano-wicking structures for evaporators, condensers, and low flow resistance micro channels that can operate under high-g accelerations.

Some fabrication and assembly embodiments may involve a stage involving an assembly process. The assembly process may include the following steps: a) die attach of the dummy chip, b) lamination, c) ALD hermetic sealing, and d) charging.

For some embodiments, after lamination, ALD $Al_2O_3$ and $SiO_2$, may be applied to encapsulate the entire exterior of the assembly. ALD $Al_2O_3$ also may act as an excellent gas diffusion barrier and hermetic seal. The ALD $Al_2O_3$ may have the ability to nucleate and grow on polymers even if the polymers do not contain chemical functional groups. The barrier properties of the ALD $Al_2O_3$ films on polymers have been excellent. The water vapor permeability may be only $1.7 \times 10^{-5}$ gm/m$^2$ day, which is about 50,000× lower than 1 gm/m$^2$ day for a typical polymer for some embodiments. For some embodiments, however, ALD $Al_2O_3$ may need to be protected from water damage. The protection may be provided by additional ALD $SiO_2$ or fluoropolymer on top of ALD alumina.

Additional Methods for Fabricating a Flexible Thermal Ground Plane

Previous sections of this Application provide means for fabricating a flexible thermal ground plane. Additional means to fabricate a flexible thermal ground plane are now described.

The flexible thermal ground plane device (FTGP) may serve as a flexible board to spread heat generated from high power integrated circuits to a large area.

Figure 21:
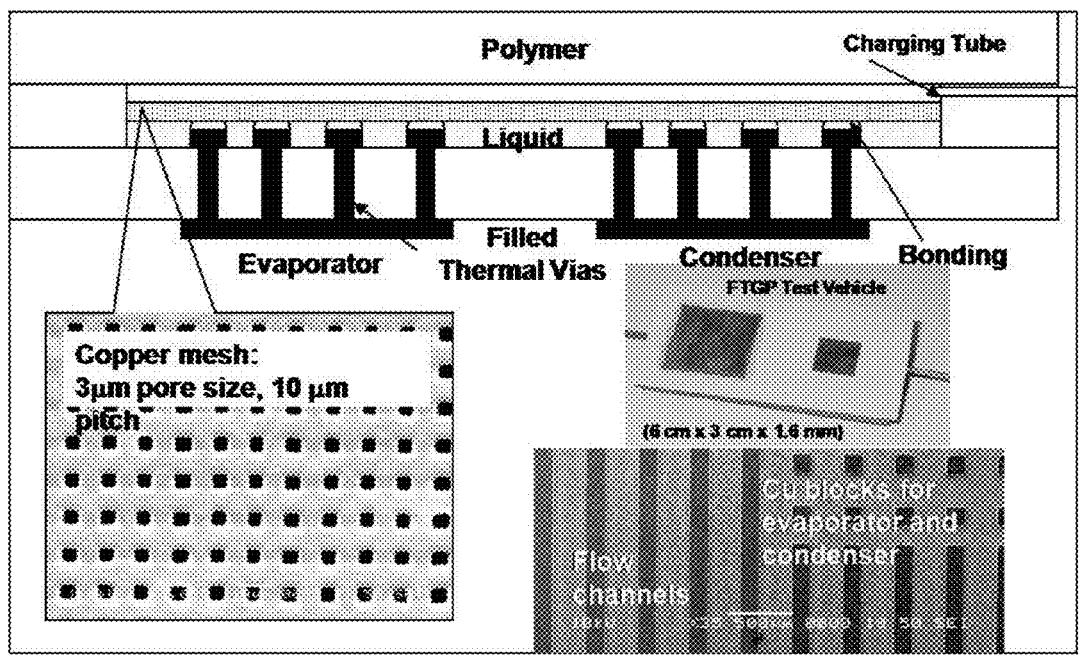
FIG. 21 shows a thermal ground plane with a micro-meshed copper sheet, in accordance with various embodiments.

Embodiments disclosed below may include the use of micro-meshed copper sheets. As shown in FIG. 21, a piece of commercially available copper mesh may be used as a membrane separating a vapor and a liquid transport region. In some embodiments, the copper mesh may be replaced by membranes with nano-scaled features to enhance heat transfer performance in some embodiments.

Methods and means for fabricating a FTGP as disclosed may be implemented as now described. It will be recognized by those of skill in the art that various modifications, alternative constructions, and equivalents may be used without departing from the spirit of the invention. Accordingly, the following description should not be taken as limiting the scope of the invention.

Figure 22:
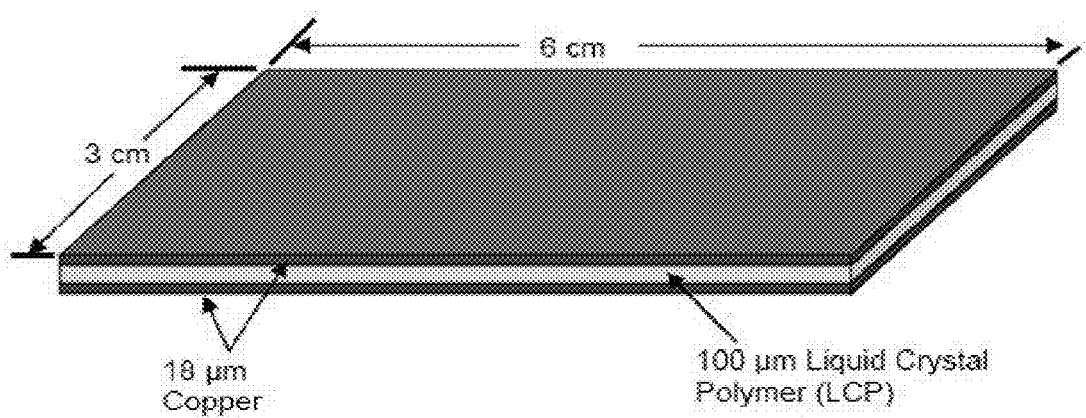
FIG. 22 shows aspects of fabricating a thermal ground plane, in accordance to various embodiments.

In one embodiment, a means for fabricating a FTGP may begin with a 100 µm (4 mil) thick liquid crystal polymer (LCP) with double sided 18 µm copper (Cu) lamination. While FIG. 22 reflects a size of a current test vehicle as 6 cm×3 cm, it can be any size the user desires. Other thickness of LCP and Cu lamination may also be used within the spirit of the invention, along with different types of LCP and different types of conductive lamination may be used.

Figure 23:
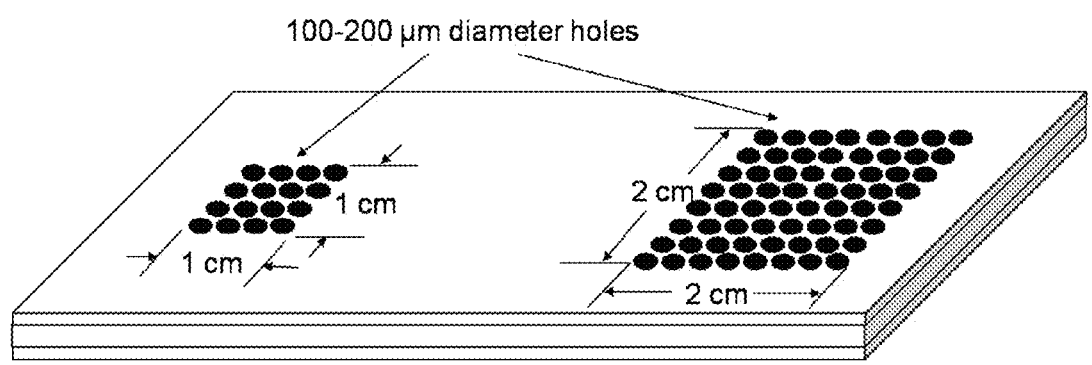
FIG. 23 shows aspects of fabricating a thermal ground plane, in accordance to various embodiments.
Figure 33:
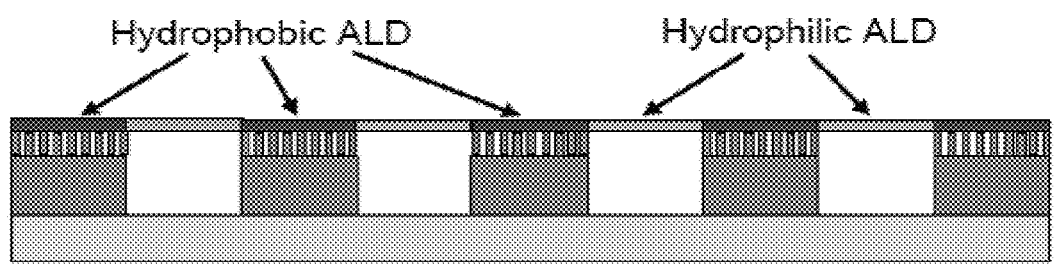
FIG. 33 shows additional aspects of fabricating a thermal ground plane, in accordance to various embodiments.

FIG. 23 shows steps for fabricating a FTGP where one may etch away the copper to serve as a mask for micro-via formation. The top surface may be coated with positive photo-resist (PR). The PR may be UV exposed and developed to form a negative mask of the via holes, which are 100-200 µm for the current test vehicle. Other hole sizes may be created. The piece may then submerged in liquid copper etchant until the LCP may be seen through the top layer of copper. The PR may then removed with acetone or other suitable solvent. FIG. 33 also shows two collections of holes. These holes may represent the eventual placement of an evaporator region and a condenser region, and may have different overall areas. Merely by way of example, the evaporator region may be 1 cm by 1 cm as shown in FIG. 23. Merely by way of example, condenser region may be 2 cm by 2 cm as shown in FIG. 23. The sizes of evaporator and condenser regions may be varied depending the different requirements of the FTGP.

Figure 24:
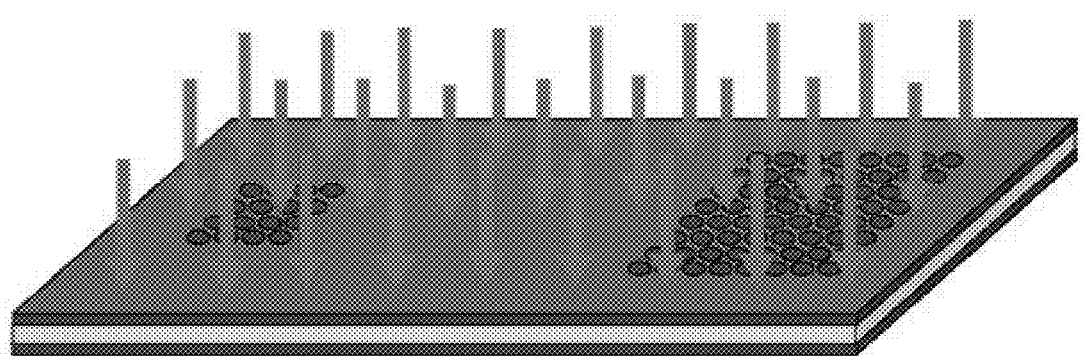
FIG. 24 shows aspects of fabricating a thermal ground plane, in accordance to various embodiments.

FIG. 24 shows additional steps that may be used for fabricating a FTGP. The FTGP vehicle or piece may be submitted to reactive ion etching ("RIE") to cut micro-vias in the LCP layer. The RIE process may use a CF4-$O_2$ plasma etch. Since the etching process may not be uniform throughout the chamber, each sample may be rotated 180° every hour to maintain an even height on all vias. Merely by way of example, the process may take approximately 10 hours with a 16 ccpm-4 ccpm flow rate. Other process times, flow rates, etching processes and materials, and rotations may be used for etching steps.

Figure 25:
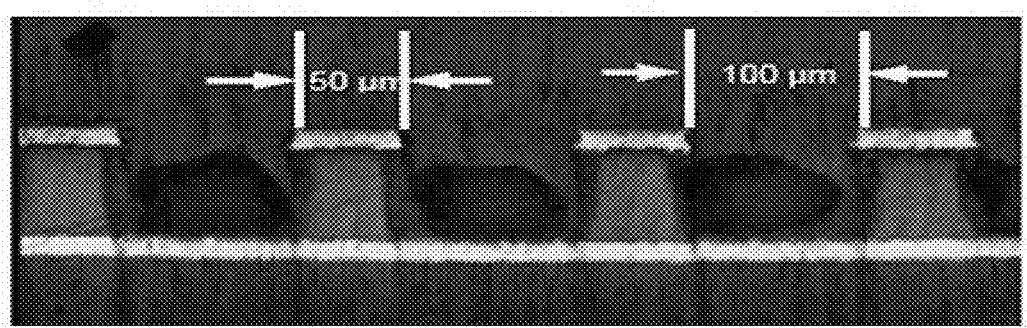
FIG. 25 shows a cross section of micro-vias of a thermal ground plane, in accordance to various embodiments.

FIG. 25 shows one cross section view of an embodiment with micro-vias formed in LCP with RIE. Other dimensioned micro-vias may be formed.

Figure 26:
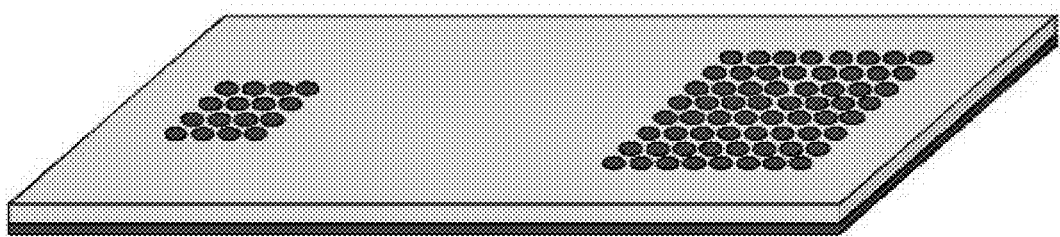
FIG. 26 shows additional aspects of fabricating a thermal ground plane, in accordance to various embodiments.

FIG. 26 shows additional steps that may be used for fabricating a FTGP. A top layer may be etched or removed and micro-vias may be filled with copper electroplating. In some embodiments, a tape or mask may be applied to the bottom and to the via areas first. Then, the piece may be immersed in liquid copper etchant. Once the top copper may have been dissolved, the tape or mask may be removed from the copper on the via areas. The piece may then be placed in an etchant again. This may prevent the etchant from dissolving the bottom layer of copper and compromising the hermeticity of the final test vehicle.

Figure 27:
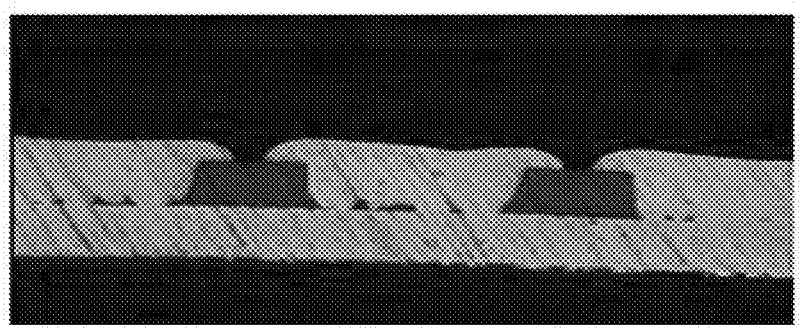
FIG. 27 shows a cross section of copper filled micro-vias of a thermal ground plane, in accordance with various embodiments.

FIG. 27 shows one embodiment with a cross section of copper filled micro-vias through LCP.

Figure 28:
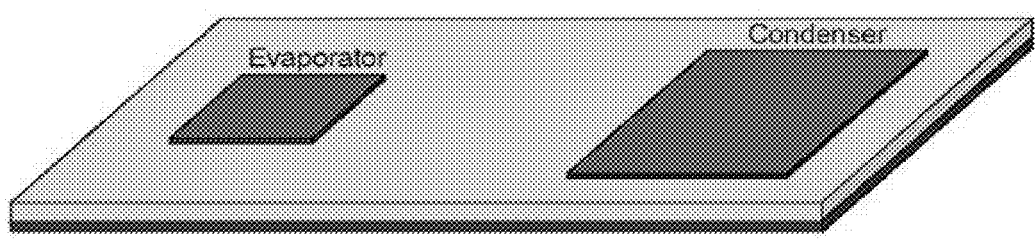
FIG. 28 shows additional aspects of fabricating a thermal ground plane, in accordance to various embodiments.

FIG. 28 shows additional steps that may be used for fabricating a FTGP. The FTGP piece may then be fastened to an acrylic frame and then placed in a copper electroplating apparatus. The frame may prevent distortion of the sample from stresses as the plating proceeds. Merely by way of example, it may take approximately 4 hours for the copper to plate above the top surface of the LCP layer. At that point, the top of the vias may meet and form one large pad. The pad may then polished smooth. Merely by way of example, a thin layer (200 nm) of Cu may be evaporated on the pad. It may be electro-plated to make it 18 μm thick and the evaporator and condenser regions may be patterned with photolithograph and copper etchant. Other thicknesses of Cu may be used in different embodiments. Different electroplating materials may also be used in embodiments.

Figure 29:
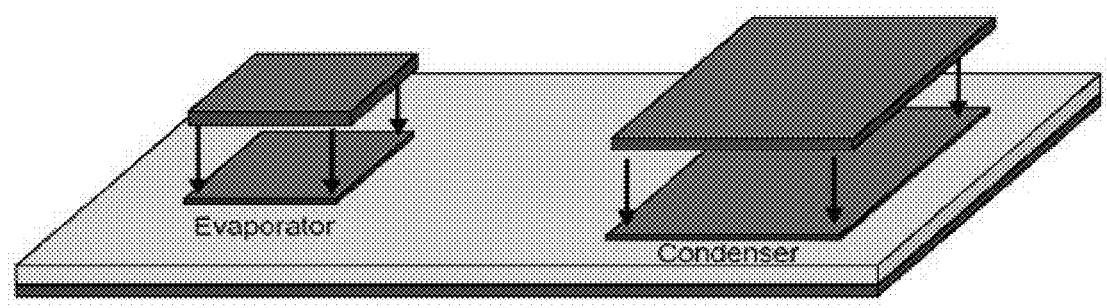
FIG. 29 shows additional aspects of fabricating a thermal ground plane, in accordance to various embodiments.

FIG. 29 shows additional steps that may be used for fabricating a FTGP. To maintain a planar mounting surface for the heat generating components, thin Cu or other material plates may be fastened to evaporator and condenser sections of the FTGP.

Figure 30:
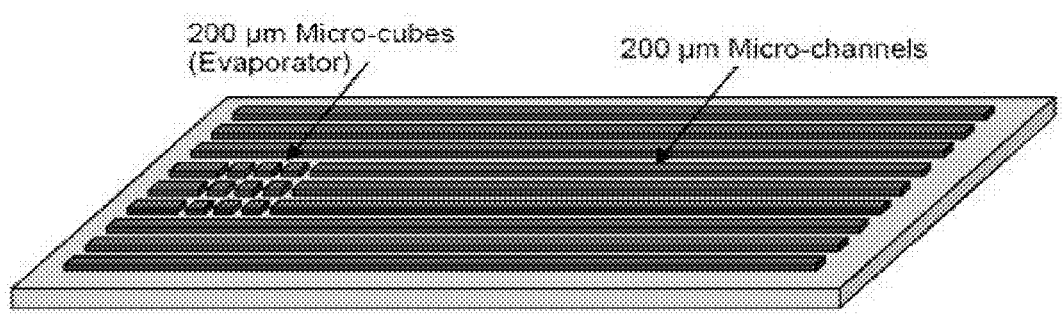
FIG. 30 shows additional aspects of fabricating a thermal ground plane, in accordance to various embodiments.

FIG. 30 shows additional steps that may be used for fabricating a FTGP. The bottom layer of copper may be electro-plated to 50 μm thick and may be patterned with photolithography and copper etchant to form the micro channels (wicking structures). The via pads (now at the bottom) may be covered with tape to prevent damage from the etchant. In some embodiments, different thicknesses for a bottom layer of copper may be used. Different sized micro-channels may also be formed for different embodiments.

Figure 31:
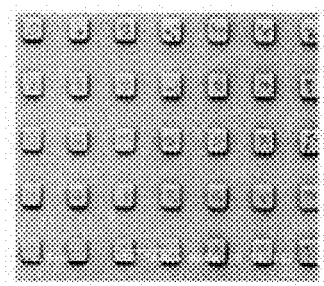
FIG. 31 provides an image of a micro-cube evaporator structure, in accordance with various embodiments.

FIG. 31 shows an SEM image of one embodiment with copper micro-cube evaporator structures formed with photolithography and copper etchant.

Figure 32:
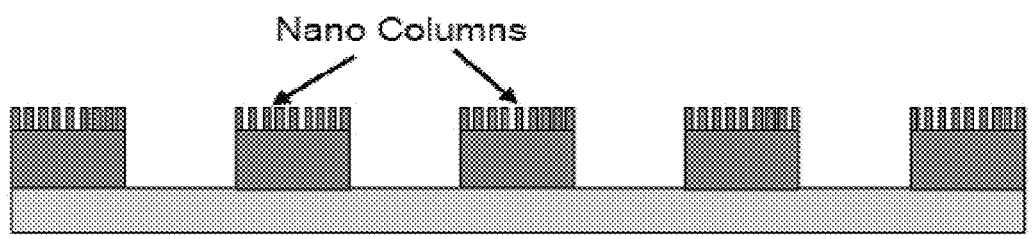
FIG. 32 shows additional aspects of fabricating a thermal ground plane, in accordance to various embodiments.

FIG. 32 shows additional steps that may be used for fabricating a FTGP. Nano wick structures may be formed on the top surface of the micro flow channels. Di-block copolymers may be used to fabricated the nanocolumns. Other polymers and materials may be used to fabricate nanocolumns.

FIG. 33 shows additional steps that may be used for fabricating a FTGP. Atomic layer deposition (ALD) coatings may be applied to a micro mesh to promote hydrophobic and hydrophilic behavior of the condensed liquid.

Figure 34:
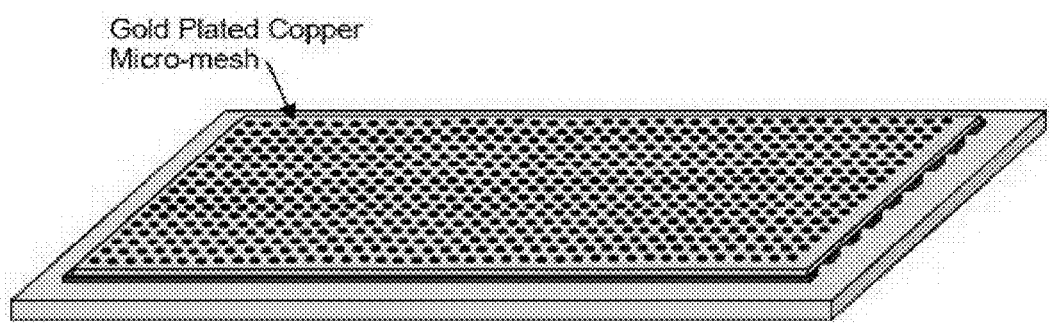
FIG. 34 shows additional aspects of fabricating a thermal ground plane, in accordance to various embodiments.

FIG. 34 shows additional steps that may be used for fabricating a FTGP. Copper channels may be coated with evaporated titanium (for adhesion) and then gold. Other materials may be used for these coating steps. The piece may then plated with gold and a micro-mesh is bonded to the cubes and channels. The mesh may serve as a wicking structure.

Figure 35:
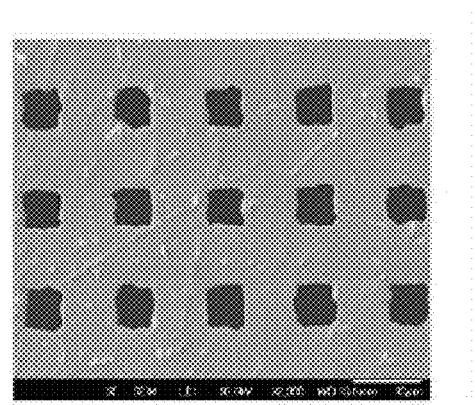
FIG. 35 shows a micro-mesh wicking structure, in accordance with various embodiments.

FIG. 35 shows an SEM image of a micro-mesh wicking structure in one embodiment. Merely by way of example, the holes may be 5 μm with a 11 μm pitch.

Figure 36:
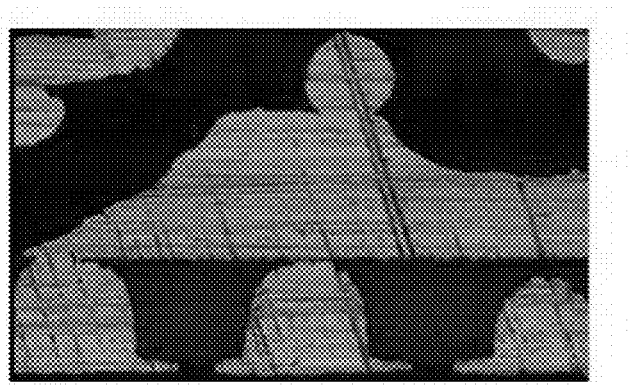
FIG. 36 shows a cross section of mesh bonded to microchannels and filled thermal vias, in accordance with various embodiments.

FIG. 36 shows a cross section view of bonded Cu mesh to the micro-channels and Cu filled thermal vias for one embodiment.

Figure 37:
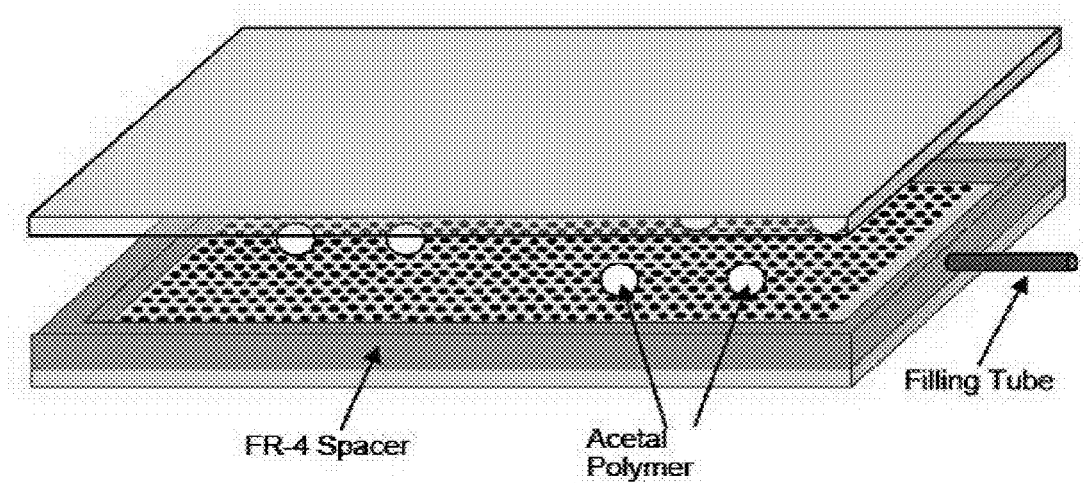
FIG. 37 shows additional aspects of fabricating a thermal ground plane, in accordance to various embodiments.

FIG. 37 shows additional steps that may be used for fabricating a FTGP. To prevent collapse of a flexible polymer cover, acetal polymer spheres may be strategically placed and bonded to the structure with epoxy resin. Acetal polymer may used because of its low water absorption rate. Other support members may be used in some embodiments. The structure may be encased with a spacer (FR-4 as an example), topped with an ALD coated LCP cover. The methods may be used for bonding are either a thermosetting (thermo-bonding) polymer or epoxy resin.

Figure 38:
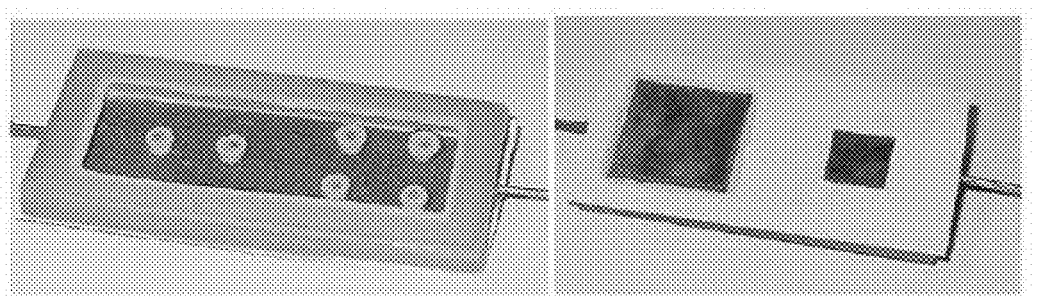
FIG. 38 shows a thermal ground plane vehicle, in accordance with various embodiments.

FIG. 38 shows the top and bottom view of an a completed FTGP vehicle in accordance with various embodiments. In some embodiments, the bonding between the copper mesh and the cubes may be done by electroplating or by thermocompression or thermosonic bonding. For hermetic sealing in some embodiments, ALD-based barrier coating may be used to cover the polymer outside surface. In addition, commercially available polymer films with barrier coating may be used as the base material, e.g. liquid crystal polymer illustrated.

Figure 39:
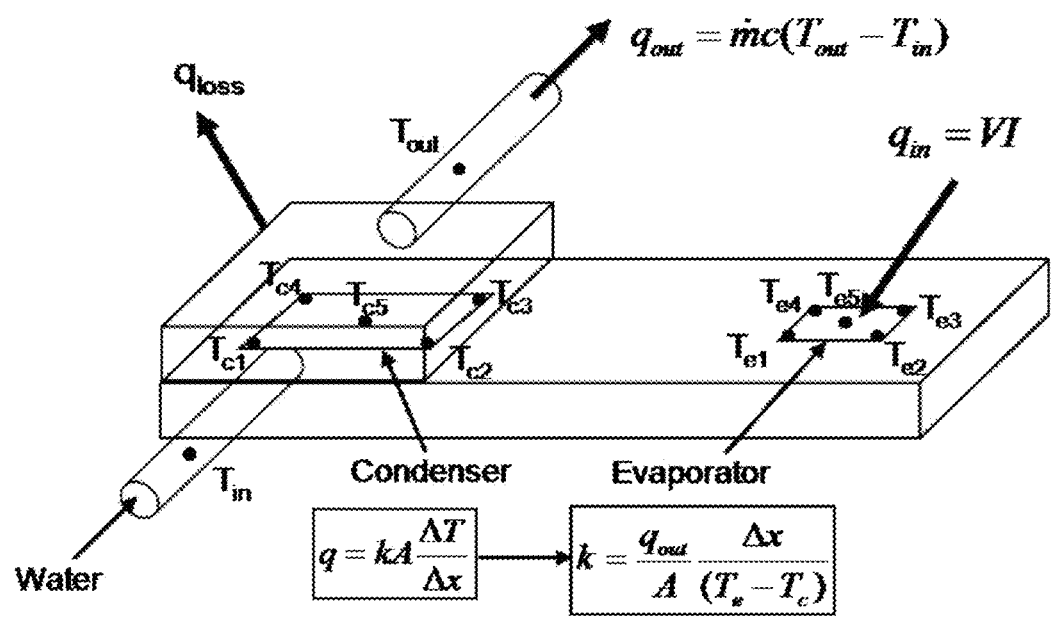
FIG. 39 shows a thermal ground plane, in accordance with various embodiments.

FIG. 38 shows one embodiment of an FTGP that may be used to test the fabrication process and to determine the effective thermal conductivity of an FTGP. A schematic of another embodiment of an FTGP apparatus is shown in FIG. 39 that may also be used for characterization of different FTGPs, including determining the effective thermal conductivity of an FTGP device.

An FTGP may be evacuated of all non-condensable gasses and then charged with a specific amount of de-ionized (DI) water. After charging, the fill tubes may be crimp sealed and then soldered shut. The condenser area may then be placed in a heat exchanger and a variable power ceramic heater may be fixed onto the evaporator pad. Water may be run through the heat exchanger and the heater may be switched on. The temperatures of the thermocouples (mounted on the FTGP) may be monitored until they reach a steady state value. At this point, the effective thermal conductivity may be calculated.

Merely by way of example, the performance of a flat polymer heat pipe may be measured by finding the effective thermal conductivity of the device. This is done by using Fourier's Law of heat conduction, for example:

$$k_{eff} = \frac{q_{out}}{A} \frac{\Delta x}{(T_e - T_c)}$$

The device, as shown in FIG. 39 for example, may be mounted in a water heat exchanger to measure $q_{out}$ which is the heat transferred by the heat pipe to the flow of water in the heat exchanger. The center to center distance of the evaporator and condenser may be defined by $\Delta x$. The cross sectional area of the heat pipe is A. $T_e$ and $T_c$ may be the average temperature of the evaporator and condenser respectively. These temperatures of these sections may be monitored with k-type thermocouples mounted with thermal epoxy in the locations indicated by the black dots in FIG. 39, for example.

The heat transferred to the water may be calculated by the relation, $$q_{out} = \dot{m}c(T_{out} - T_{in})$$

The temperatures of the water in, $T_{in}$, and the water out, $T_{out}$, may also monitored with k-type thermocouples. The mass flow rate of the water may be defined as $\dot{m}$ and the specific heat of the water may be defined as c.

Merely by way of example, a 0.7 cm² square ceramic heater may be clamped to the evaporator and supplied the heat to the device.

Figure 40:
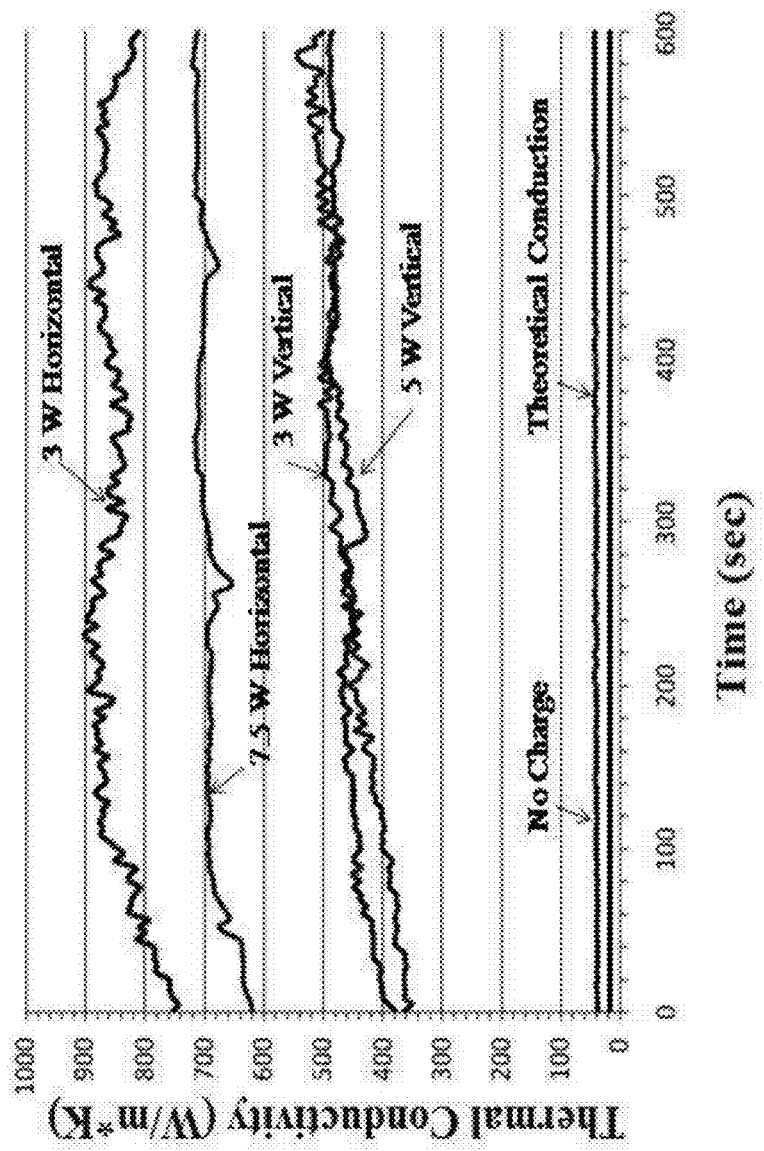
FIG. 40 provides some results regarding effective thermal conductivity for a thermal plane device, according to various embodiments.

Merely by way of example, a flat polymer heat pipe testing system as shown in FIG. 39 for example may be used. The electrical power supplied to the heater may be adjusted to 3, 5, or 7.5 W, for example, and the heat pipe may be oriented either horizontally or vertically with adverse gravity (evaporator on top). The device may operated until steady state temperatures were achieved. FIG. 40 provides some data regarding the effective thermal conductivity calculated with time.

FIG. 40 may show that the best performance of 850 W/m*K occurred at an input power of 3 W in the horizontal orientation and the worst performance, 450 W/m*K, occurred at 5 W in the vertical orientation. The effective thermal conductivity may also measured for the heat pipe containing no charge and heat transfer was due to pure conduction through the LCP, FR4, glass, and air, merely by way of example. This may then compared to the theoretical conductivity of the non-charged heat pipe and this may also be seen in FIG. 40.

Having described several embodiments, it will be recognized by those of skill in the art that various modifications, alternative constructions, and equivalents may be used without departing from the spirit of the invention. Accordingly, the above description should not be taken as limiting the scope of the invention, which is defined in the following claims.

That which is claimed:

1. A thermal ground plane comprising:
   a first substrate member;
   a second substrate member configured to enclose a working fluid in conjunction with the first substrate member;
   an evaporator region comprising a first wicking structure disposed at least partially on at least one of the first substrate member and the second substrate member;
   a condenser region comprising a second wicking structure disposed at least partially on at least one of the first substrate member and the second substrate member, wherein the evaporator region and the condenser region are separate and distinct regions located at a distance from each other, and wherein the first wicking structure and the second wicking structure are separate wicking structures;
   a liquid channel disposed between the condenser region and the evaporator region;
   a vapor core disposed at least partially between the first substrate member and the second substrate member; and
   a mesh layer disposed between the first substrate member and the second substrate member, and coupled with the wicking structure of the evaporator region and the wicking structure of the condenser region such that the mesh layer is spaced apart from the first and second substrate members to define the liquid channel,
   wherein at least a majority of the working fluid, in liquid form, flows through the liquid channel from the condenser region to the evaporator region.

2. The thermal ground plane according to claim 1, wherein the second substrate member and the first substrate member are hermetically sealed along more than two edges.

3. The thermal ground plane according to claim 1, wherein the first member and the second member are flexible.

4. The thermal ground plane according to claim 1, wherein the thermal ground plane has a thickness less than 3 mm.

5. The thermal ground plane according to claim 1, wherein the thermal ground plane has an in-plane thermal conductivity of greater than 500 W/mK.

6. The thermal ground plane according to claim 1, wherein either or both the first substrate member and the second substrate member comprise either or both Kapton or a polymer.

7. The thermal ground plane according to claim 1, wherein the mesh layer at least in part separates the liquid channel from the vapor core.

8. The thermal ground plane according to claim 1, wherein the vapor core includes one or more support structures disposed between the mesh layer and either the second substrate member or the first substrate member.

9. A thermal ground plane comprising:
   a first substrate member comprising Kapton;
   a second substrate member comprising Kapton and coupled with the first substrate member;
   an evaporator region comprising a first wicking structure disposed at least partially on one of the first substrate member and the second substrate member;
   a condenser region comprising a second wicking structure disposed at least partially on one of the first substrate member and the second substrate member, wherein the evaporator region and the condenser region are separate and distinct regions located at a distance from each other, and wherein the first wicking structure and the second wicking structure are separate wicking structures;
   a liquid channel disposed between the condenser region and the evaporator region;
   a vapor core disposed at least partially between the first substrate member and the second substrate member; and
   a mesh layer disposed between the first substrate member and the second substrate member, and coupled with the wicking structure of the evaporator region and the wicking structure of the condenser region such that the mesh layer is spaced apart from the first substrate member and the second substrate member to define a liquid channel,
   wherein a working fluid, in liquid form, flows through the liquid channel from the condenser region to the evaporator region.

10. The thermal ground plane according to claim 9, wherein the working fluid flows through the liquid channel without passing through the vapor core.

11. The thermal ground plane according to claim 9, wherein the vapor core includes one or more support structures disposed between the mesh layer and either the second substrate member or the first substrate member.

12. The thermal ground plane according to claim 9, wherein at least a portion of the liquid channel is disposed on the first substrate member or the second substrate member.

13. The thermal ground plane according to claim 9, wherein at least a portion of the liquid channel is disposed on the first substrate member as etched micro-channels on the substrate member or etched micro-cubes on the first substrate member.

14. The thermal ground plane according to claim 9, wherein the liquid channel is patterned on the first substrate member with photolithography.

15. The thermal ground plane according to claim 9, wherein the mesh layer is bonded to either or both the first substrate member or the second substrate member.

16. The thermal ground plane according to claim 9, wherein the mesh layer comprises a hydrophilic region.

17. The thermal ground plane according to claim 9, wherein the mesh layer comprises a hydrophobic region.

18. The thermal ground plane according to claim 9, wherein the second substrate member and the first substrate member are hermetically sealed along more than two edges.

19. A thermal ground plane comprising:
a first substrate member comprising Kapton;
a second substrate member comprising Kapton and coupled with the first substrate member;
an evaporator region comprising a first wicking structure disposed at least partially on one of the first substrate member and the second substrate member;
a condenser region comprising a second wicking structure disposed at least partially on one of the first substrate member and the second substrate member, wherein the evaporator region and the condenser region are separate and distinct regions located at a distance from each other, and wherein the first wicking structure and the second wicking structure are separate wicking structures;
a liquid channel disposed between the condenser region and the evaporator region;
a vapor core disposed at least partially between the first substrate member and the second substrate member; and
a mesh layer disposed between the first substrate member and the second substrate member, and coupled with the wicking structure of the evaporator region and the wicking structure of the condenser region such that the mesh layer is spaced apart from the first substrate member and the second substrate member to define a liquid channel.

20. The thermal ground plane according to claim 1, wherein the first wicking structure comprises a mesh.

21. The thermal ground plane according to claim 1, wherein the first wicking structure comprises a plurality of rods bonded to either or both the first substrate and the second substrate.

22. The thermal ground plane according to claim 1, wherein the second wicking structure comprises a mesh.

23. The thermal ground plane according to claim 1, wherein the second wicking structure comprises a plurality of rods bonded to either or both the first substrate and the second substrate.

24. The thermal ground plane according to claim 9, wherein the first wicking structure comprises a mesh.

25. The thermal ground plane according to claim 9, wherein the first wicking structure comprises a plurality of rods bonded to either or both the first substrate and the second substrate.

26. The thermal ground plane according to claim 9, wherein the second wicking structure comprises a mesh.

27. The thermal ground plane according to claim 9, wherein the second wicking structure comprises a plurality of rods bonded to either or both the first substrate and the second substrate.

* * * * *